United States Patent
Brockmeier et al.

(10) Patent No.: US 11,990,520 B2
(45) Date of Patent: May 21, 2024

(54) METHOD OF MANUFACTURING A SEMICONDUCTOR DEVICE HAVING FRAME STRUCTURES LATERALLY SURROUNDING BACKSIDE METAL STRUCTURES

(71) Applicant: Infineon Technologies AG, Neubiberg (DE)

(72) Inventors: Andre Brockmeier, Villach (AT); Guenter Denifl, Annenheim (AT); Ronny Kern, Finkenstein (AT); Michael Knabl, Finkenstein (AT); Matteo Piccin, Villach (AT); Francisco Javier Santos Rodriguez, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 35 days.

(21) Appl. No.: 17/532,030

(22) Filed: Nov. 22, 2021

(65) Prior Publication Data
US 2022/0085174 A1 Mar. 17, 2022

Related U.S. Application Data

(63) Continuation of application No. 16/715,439, filed on Dec. 16, 2019, now Pat. No. 11,211,459.

(30) Foreign Application Priority Data

Dec. 17, 2018 (DE) .......................... 102018132447.2

(51) Int. Cl.
*H01L 21/02* (2006.01)
*H01L 21/56* (2006.01)
(Continued)

(52) U.S. Cl.
CPC .... *H01L 29/1608* (2013.01); *H01L 21/02378* (2013.01); *H01L 21/565* (2013.01);
(Continued)

(58) Field of Classification Search
None
See application file for complete search history.

(56) References Cited

U.S. PATENT DOCUMENTS

| | | | |
|---|---|---|---|
| 2001/0016369 A1 | 8/2001 | Zandman et al. | |
| 2006/0175659 A1 | 8/2006 | Sleight | |

(Continued)

FOREIGN PATENT DOCUMENTS

| | | |
|---|---|---|
| CN | 103325690 A | 9/2013 |
| CN | 104112729 A | 10/2014 |

(Continued)

OTHER PUBLICATIONS

An overview of silicon carbide ceramic materials (no date) High Quality Ceramic Material Supplier. Available at: https://www.preciseceramic.com/blog/overview-of-silicon-carbide-ceramic.html (Accessed: Oct. 9, 2023). (Year: 2023).*

(Continued)

*Primary Examiner* — Jay C Chang
(74) *Attorney, Agent, or Firm* — Murphy, Bilak & Homiller, PLLC

(57) ABSTRACT

A method of manufacturing a semiconductor device includes: providing a silicon carbide substrate that includes device regions and a grid-shaped kerf region laterally separating the device regions; forming a mold structure on a backside surface of the grid-shaped kerf region; forming backside metal structures on a backside surface of the device regions; and separating the device regions, wherein parts of the mold structure form frame structures laterally surrounding the backside metal structures.

21 Claims, 14 Drawing Sheets

(51) Int. Cl.
*H01L 21/78* (2006.01)
*H01L 23/31* (2006.01)
*H01L 23/544* (2006.01)
*H01L 29/16* (2006.01)

(52) U.S. Cl.
CPC .......... *H01L 21/78* (2013.01); *H01L 23/3114* (2013.01); *H01L 23/544* (2013.01)

(56) References Cited

U.S. PATENT DOCUMENTS

| | | |
|---|---|---|
| 2008/0194082 A1 | 8/2008 | Kato et al. |
| 2011/0204382 A1 | 8/2011 | Traut et al. |
| 2012/0080690 A1 | 4/2012 | Berger et al. |
| 2012/0083098 A1 | 4/2012 | Berger et al. |
| 2013/0037935 A1 | 2/2013 | Xue et al. |
| 2013/0203215 A1 | 8/2013 | Hung et al. |
| 2013/0234308 A1 | 9/2013 | Yamada et al. |
| 2013/0240909 A1 | 9/2013 | Hiramatsu et al. |
| 2013/0306977 A1 | 11/2013 | Fujibayashi et al. |
| 2014/0001615 A1 | 1/2014 | Otremba et al. |
| 2014/0070420 A1 | 3/2014 | Sapone |
| 2014/0225125 A1 | 8/2014 | Berger et al. |
| 2014/0284624 A1 | 9/2014 | Beer et al. |
| 2015/0021624 A1 | 1/2015 | Meyer et al. |
| 2015/0179570 A1* | 6/2015 | Marimuthu ............ H01L 24/97 438/126 |
| 2016/0056057 A1 | 2/2016 | Yu et al. |
| 2016/0204023 A1 | 7/2016 | Imaoka et al. |
| 2017/0033011 A1* | 2/2017 | Rupp .................... H01L 21/78 |
| 2017/0033026 A1 | 2/2017 | Ho et al. |
| 2017/0194230 A1* | 7/2017 | Prechtl ............... H01L 21/0214 |
| 2017/0250158 A1 | 8/2017 | Chinnusamy et al. |
| 2017/0278930 A1 | 9/2017 | Ruhl et al. |
| 2017/0284951 A1 | 10/2017 | Pindl et al. |
| 2017/0288176 A1 | 10/2017 | Beer et al. |
| 2017/0309517 A1 | 10/2017 | Rupp et al. |
| 2017/0358494 A1 | 12/2017 | Roesner et al. |
| 2018/0019215 A1 | 1/2018 | Hiyoshi et al. |
| 2018/0068920 A1 | 3/2018 | Leung et al. |
| 2018/0158916 A1 | 6/2018 | Schulze et al. |

FOREIGN PATENT DOCUMENTS

| | | |
|---|---|---|
| CN | 106409760 A | 2/2017 |
| CN | 108140624 A | 6/2018 |
| CN | 108257877 B | 4/2022 |
| DE | 102014104630 A1 | 10/2014 |
| DE | 102014114932 A1 | 4/2015 |
| DE | 102015114304 A1 | 3/2016 |
| DE | 102015112648 A1 | 2/2017 |
| EP | 1401021 A1 | 3/2004 |
| EP | 1679743 A2 | 7/2006 |
| JP | H08288500 A | 11/1996 |
| JP | 2000223623 A | 8/2000 |
| JP | 2002280531 A | 9/2002 |
| JP | 2004058349 A | 2/2004 |
| JP | 2007210115 A | 8/2007 |
| JP | 2012146694 A | 8/2012 |
| JP | 2012146695 A | 8/2012 |
| JP | 2014056863 A | 3/2014 |
| WO | 2009045859 A1 | 4/2009 |
| WO | 2014080874 A1 | 5/2014 |
| WO | 2015084858 A1 | 6/2015 |
| WO | 2016140229 A1 | 9/2016 |

OTHER PUBLICATIONS

Mason, T.O. (no date) Ceramic composition and properties, Encyclopædia Britannica. Available at: https://www.britannica.com/technology/ceramic-composition-and-properties (Accessed: Oct. 9, 2023). (Year: 2023).*

"Thin Wafer Laser Debonding—Fast and Without Fuss", Coherent, White Paper, accessed online Dec. 13, 2019 at https://www.coherent.com/assets/pdf/Thin-Wafer-Laser-Debonding-Fast-and-Without-Fuss.pdf.

* cited by examiner

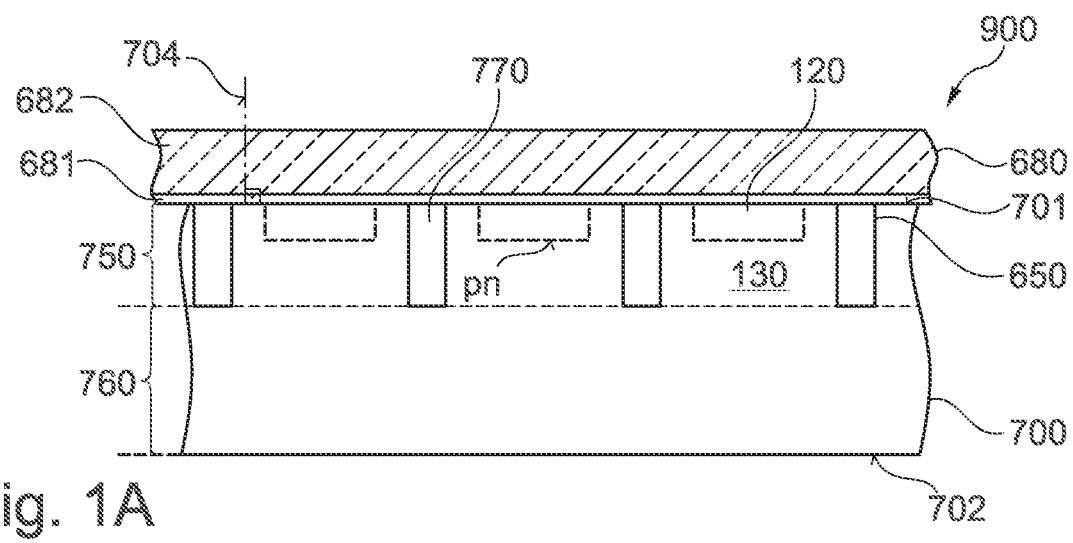
Fig. 1A
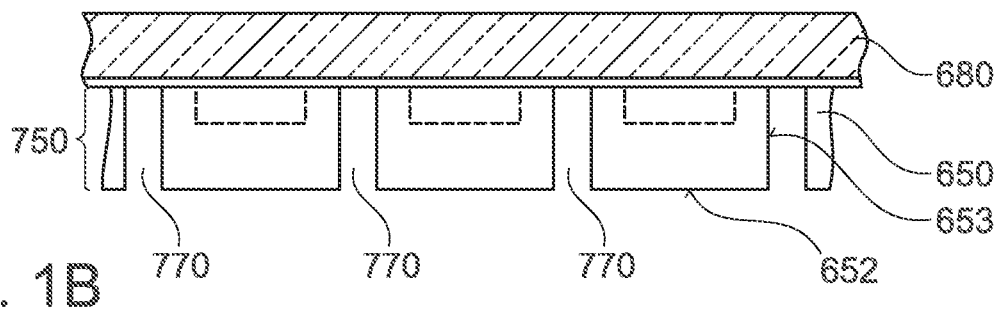
Fig. 1B
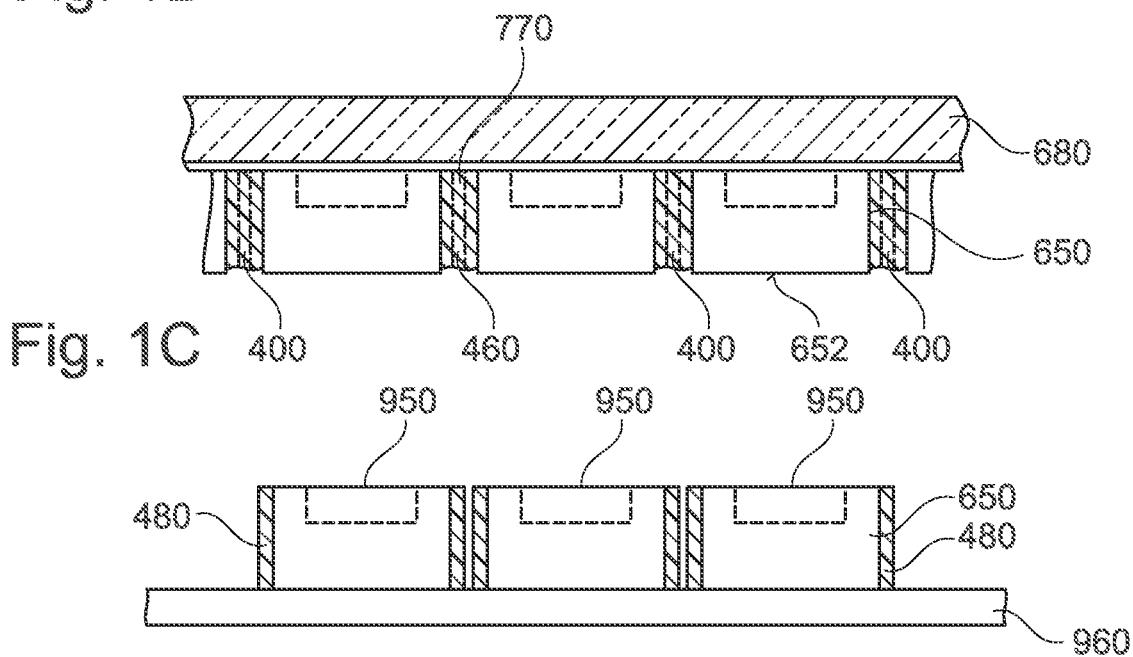
Fig. 1C
Fig. 1D

METHOD OF MANUFACTURING A SEMICONDUCTOR DEVICE HAVING FRAME STRUCTURES LATERALLY SURROUNDING BACKSIDE METAL STRUCTURES

TECHNICAL FIELD

The present disclosure relates to a method of manufacturing a semiconductor device and to a semiconductor device.

BACKGROUND

Semiconductor wafers are typically available in standard wafer sizes and/or thicknesses. For example, standard wafer diameters may be 2 inch (50 mm), 4 inch (100 mm) or 6 inch (150 mm). For silicon carbide wafers, a standard wafer thickness may be, for example, at least 0.1% or at least 0.15% of the standard wafer diameter (e.g., for a 6 inch wafer, 350 μm). Attempts have been made to reduce the final thickness of semiconductor material to improve device characteristics. For example, in some power semiconductor devices a vertical load current flows between a front side and a backside of a semiconductor die and a thinner semiconductor die reduces the on-state resistance. Wafer split methods lift off thin wafers from thick host wafers and avoid extensive grinding processes. With decreasing wafer thickness, the handling of semiconductor wafers is getting more complex. Auxiliary carriers are bonded onto the surface of semiconductor wafers and increase mechanical stability during and after wafer split. The auxiliary carriers can be removed before wafer dicing.

SUMMARY

An embodiment of the present disclosure relates to a method of manufacturing a semiconductor device. An auxiliary carrier and a silicon carbide substrate are provided. The silicon carbide substrate includes an idle layer (sometimes also called "handle layer") and a device layer. The device layer is located between the idle layer and a main surface of the silicon carbide substrate at a front side of the silicon carbide surface. The device layer includes a plurality of laterally separated device regions. Each device region extends from the main surface to the idle layer. The auxiliary carrier is structurally connected with the silicon carbide substrate at the front side. The idle layer is removed. A mold structure is formed. The mold structure fills a grid-shaped groove that laterally separates the device regions. The device regions are separated. Parts of the mold structure form frame structures laterally surrounding the device regions.

Another embodiment of the present disclosure relates to another method of manufacturing a semiconductor device. A silicon carbide substrate is provided that includes a plurality of device regions and a grid-shaped kerf region that laterally separates the device regions. A grid-shaped mold structure is formed on a backside surface of the kerf region. Backside metal structures are formed on a backside surface of the device regions. The device regions are separated, wherein parts of the mold structure form frame structures laterally surrounding the backside metal structures.

A further embodiment of the present disclosure relates to a semiconductor device. The semiconductor device includes a silicon carbide body, a first load electrode at a front side of the silicon carbide body, a second load electrode at a backside of the silicon carbide body, and a frame structure including a resin. The frame structure is in contact with a sidewall of the silicon carbide body and laterally surrounds the silicon carbide body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of the semiconductor device and the method of manufacturing a semiconductor device and together with the description serve to explain principles of the embodiments. Further embodiments are described in the following detailed description and the claims.

FIG. 1A-1D show schematic cross-sectional views of a wafer assembly for illustrating a method of forming semiconductor devices with frame structures from a mold material according to an embodiment that includes dicing before wafer thinning.

DETAILED DESCRIPTION

Figure 2A:
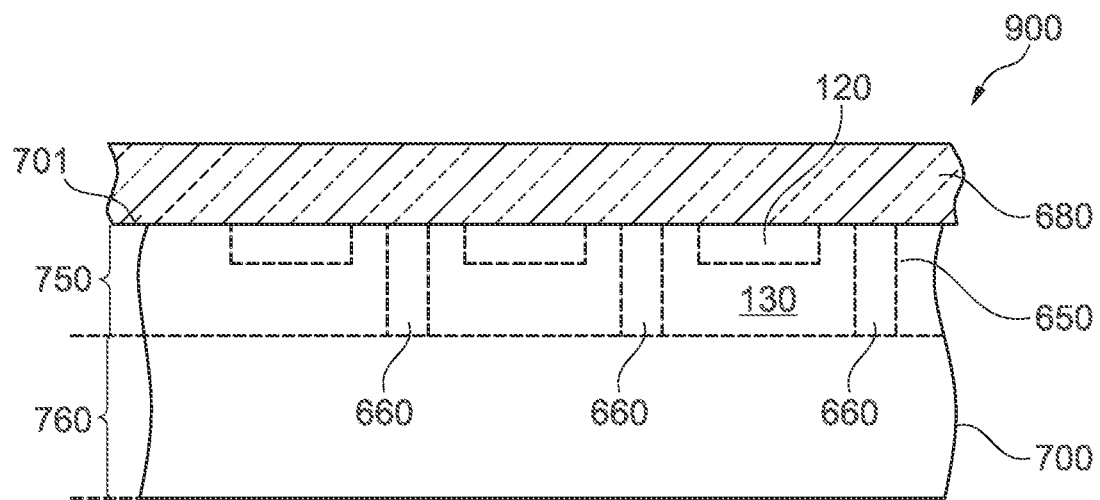
FIG. 2A-2B show schematic cross-sectional views of a wafer assembly for illustrating a method of forming semiconductor devices with frame structures from a mold material according to an embodiment that includes wafer thinning before dicing.

In the following detailed description, reference is made to the accompanying drawings, which form a part hereof and in which are shown by way of illustrations specific embodiments in which a silicon carbide device and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. In particular, all features described in connection with an embodiment of the method are also disclosed for embodiments of the semiconductor device and vice versa.

The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising", "with" and the like are open, and the terms indicate the presence of stated structures, elements or features but do not preclude additional elements or features. The articles "a", "an" and "the" are intended to include the plural as well as the singular, unless the context clearly indicates otherwise.

Furthermore, the term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for a parameter include the boundary values. For example, a range for a parameter y from a to b reads as a≤y≤b. A parameter y with a value of at least c reads as c≤y and a parameter y with a value of at most d reads as y≤d.

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

A plate is a thin, flat sheet or stripe of metal, semiconductor material, insulator material or a combination of them with approximately uniform thickness. The plate has approximately uniform thickness in a vertical cross-section and an arbitrary horizontal shape. For example, the horizontal shape of the plate may be elliptical, circular, or polygonal, for example hexagonal, rectangular or quadratic.

The term "dicing" describes cutting a substrate that includes a semiconductor material, e.g. a semiconductor wafer, into a plurality of rectangular cuboids denominated as semiconductor dies in the following. Dicing may include one or more chemical, mechanical or other physical processes like etching, sawing and laser cutting of the semiconductor material. In addition to the semiconductor material, other materials, e.g., dielectric layers and/or metallization layers may be cut during the dicing process. After dicing, a further structure, e.g., an auxiliary carrier attached to the front side or to the backside of the semiconductor dies and/or an auxiliary grid formed between the diced semiconductor dies holds the semiconductor dies at the positions the semiconductor dies have had to each other before dicing. A wafer composite includes a plurality of semiconductor dies at their original positions relative to each other.

The phrase "separating semiconductor dies" describes a process that detaches single semiconductor dies from the wafer composite. Separations of semiconductor dies may be performed with the semiconductor dies temporarily attached on a re-distribution tape or on a pick-up tape. During separation or after separation of the semiconductor dies the semiconductor dies lose their original positional relationship, which the semiconductor dies had to each other in a semiconductor substrate, e.g., by stretching a pick-up tape and/or picking single semiconductor dies from a pick-up tape. Separating semiconductor dies may include one or more chemical, mechanical or other physical processes effective on an auxiliary grid and/or an auxiliary carrier like etching, sawing and laser cutting.

According to an embodiment a method of manufacturing a semiconductor device, e.g., a silicon carbide, device may include providing a semiconductor substrate, e.g., a silicon carbide substrate, and an auxiliary carrier.

The semiconductor device manufactured with embodiments of methods described herein may be a power semiconductor device. For example, the semiconductor device may be a FET (field-effect transistor), e.g. a MOSFET (metal oxide semiconductor FET) or a JFET (junction FET), an IGBT (insulated gate bipolar transistor), a diode, e.g., a pn diode, a Schottky diode, an MCD (MOS controlled diode), an MPS (merged-pin Schottky) diode or a merged-pin heterojunction diode, a superjunction semiconductor device or a combination of at least two of them.

In the following, embodiments of the methods and embodiments of the semiconductor devices are explained in connection with silicon carbide as a semiconductor material of the semiconductor substrate. However, the methods described herein may be suitable for providing a semiconductor device with any other semiconductor material by replacing the silicon carbide substrate with a different semiconductor substrate. For example, another wide-bandgap semiconductor material (e.g., with GaN, AlN or $Ga_2O_3$ as main constituents) may be used as a semiconductor material.

Furthermore, even though the method is described in connection with a semiconductor substrate including only one type of semiconductor material (namely: silicon carbide), the semiconductor substrate may also include different types of semiconductor material. For example, the semiconductor substrate may include an epitaxial layer of a first semiconductor material (e.g., GaN) and a semiconductor wafer of a second, different semiconductor material (e.g., Si), onto which the first semiconductor material has been epitaxially grown. In addition or as an alternative, the semiconductor substrate may include a layer stack of different semiconductor materials and/or different compositions of semiconductor materials. For example, in the case of an epitaxial layer of a first semiconductor material on a semiconductor wafer of a second semiconductor material, an intermediary layer stack (e.g., for matching the lattice constants and/or the thermal expansion coefficients of the first and the second semiconductor material) may be positioned between epitaxial layer and the wafer.

The method is particularly suitable for providing a semiconductor device with a semiconductor substrate of a high-priced semiconductor material. Throughout this application, a high-priced semiconductor material is a semiconductor material that requires a high-priced semiconductor wafer and/or a high-priced growth substrate for providing the semiconductor device. "High-priced" in this context may mean that the semiconductor wafer and/or the growth substrate is more expensive than a silicon wafer of the same size, e.g. with a comparable crystal quality. In addition or as an alternative, "high-priced" may mean that at least 30%, or at least 40%, of the final costs for the bare-die part of the semiconductor device (i.e., without packaging or circuitry) may be determined by the price of the semiconductor wafer and/or the growth substrate.

The silicon carbide substrate may be a silicon carbide wafer as a growth substrate onto which an epitaxial material may be grown. In addition or as an alternative, the silicon carbide substrate may be an epitaxial layer. For example, the silicon carbide substrate may have been epitaxially grown on a silicon carbide wafer as a growth substrate, after which epitaxial growth at least part of the silicon carbide wafer is removed. It may also be possible that the silicon carbide substrate corresponds to the silicon carbide wafer, wherein doping regions may have been introduced into the silicon carbide wafer.

The auxiliary carrier may comprise at least one of the following materials or may consist of one of the following materials: glass, carbon (e.g., graphite), ceramics, semiconductor material (e.g., silicon), metal (e.g., molybdenum and/or TaN), plastic material. In addition, or as an alternative, a high temperature resistant material may be used as a material for the auxiliary carrier, wherein a melting point of the high temperature resistant material is above 1800° C. The auxiliary carrier may be a plate or a foil. A cross-section of the auxiliary carrier may be circular or polygonal. In general, the auxiliary carrier may be formed mechanically stabilizing. The auxiliary carrier may be bonded to the silicon carbide substrate, e.g. via a reversible bond (i.e., a bond that may be resolved without destroying any of the bonding members) or via an irreversible bond. For example, an irreversible bond may be used if subsequent process steps require high temperatures.

In some embodiments, the auxiliary carrier may include a glass with low glass transition temperature Tg. For example, the glass transition temperature may be below 600° C., wherein the material of the auxiliary carrier may be a soda-lime glass. An auxiliary carrier from a source material that includes glass with low glass transition temperature may be press-molded directly on the silicon carbide substrate. A casting mold used for press-molding of the auxiliary carrier and for bonding the auxiliary carrier onto the silicon carbide substrate may also be used for patterning the auxiliary carrier. In general, the auxiliary carrier may be formed with openings that expose sections of a front side metallization formed on the device regions before providing the auxiliary carrier.

The silicon carbide substrate may include an idle layer and a device layer between a main surface of the silicon carbide substrate at a front side of the silicon carbide substrate and the idle layer. The device layer may include the portion of the silicon carbide substrate in which a current-carrying part of the semiconductor device is formed. The device layer may include doping regions and/or further structures from non-semiconducting materials, for example trench gate structures extending from the main surface into the device layer. After producing the semiconductor device (also called "finalized semiconductor device" in the following), the idle layer will not be part of the semiconductor device obtained from the device layer.

The device layer includes a plurality of device regions, wherein each device region extends from the main surface to the idle layer. Each device region may include a plurality of differently doped regions that constitute an electric functionality of a finalized semiconductor device obtained from the device region. Each device region may include the same functional circuit (i.e., the functional circuit may be copied along the device regions). Each device region may be connected to a front side metallization and to a backside metallization of the finalized semiconductor device.

From each device region a dicing process obtains a single semiconductor die ("chip"), wherein the semiconductor die includes a block of semiconducting material, in and/or on which a given functional circuit is fabricated. Before dicing, each semiconductor die forms one device region of the silicon carbide substrate.

The device regions may be laterally separated from each other and may be arranged in a matrix. For example, a grid-shaped part of the silicon carbide substrate between the device regions may form a kerf region. That is to say, in a top view onto the silicon carbide substrate, the kerf region may have the shape of a grid. The kerf region may be devoid of such elements and structures that become integral part of a semiconductor device. The kerf region may include elements and structures temporarily used during wafer-level manufacturing processes and device characterization, for example, electrical test circuits and/or alignment marks. A portion of the kerf region may be consumed during a dicing process. For example, a dicing process using a mechanical saw or a laser may produce scribe lines in the kerf region between the device regions.

The auxiliary carrier is structurally connected with the silicon carbide substrate at the front side of the silicon carbide substrate. The auxiliary carrier may be in direct contact with the main surface or one or more layers or structures of a material different from the material of the silicon carbide substrate and/or the auxiliary carrier may be formed between the auxiliary carrier and the main surface. If a plurality of layers or structures is formed between the auxiliary carrier and the main surface, the layers or structures may differ by their materials. At least one of the layers (or structures) may be in direct contact with at least one of the silicon carbide substrate and the auxiliary carrier. For example a front side metallization, which is in electrical contact with doped regions in the device regions, and/or insulating structures electrically insulating neighboring portions of the front side metallization, may be formed between the auxiliary carrier and the main surface of the silicon carbide substrate.

In some embodiments, the auxiliary carrier may be reversibly connected with the silicon carbide substrate, with a front side metallization and/or with insulating structures on the main surface of the silicon carbide substrate. For example, the auxiliary carrier may be reversibly bonded to the front side of the silicon carbide substrate through a glue, an adhesive layer and/or an adhesive foil. In this context, "reversibly" may mean that the auxiliary carrier may be removed from the silicon carbide substrate, e.g. by using a mechanical force, a chemical solvent, thermal energy and/or radiation energy (e.g. with UV and/or laser radiation), without destroying the silicon carbide substrate and/or the auxiliary carrier.

In other embodiments, the auxiliary carrier may be irreversibly connected with the silicon carbide substrate. For example, structurally connecting the auxiliary carrier with the silicon carbide substrate may include at least one of direct bonding, reactive bonding, friction bonding, soldering (e.g., diffusion soldering). If the auxiliary carrier is formed from a source material with glass, said source material may include glass powder and/or a glass frit, by way of example.

In case of direct bonding a working surface of the auxiliary carrier and a top surface at the front side of the silicon carbide substrate are sufficiently flat, smooth and clean. Adhesion between directly bonded auxiliary carrier and the top surface at the front side of the silicon carbide substrate may be based on chemical bonds, hydrogen bonds, van-der-Waals bonds, metallic bonds, ionic bonds and/or covalent bonds between the silicon carbide substrate and the auxiliary carrier. Direct bonding may include exerting a physical force that presses the silicon carbide substrate and the auxiliary carrier against each other, a thermal treatment of at least one of two bonding surfaces at moderate temperature or a combination of both (fusion bonding, thermocompressive bonding, bonding by atomic rearrangement). Direct bonding may include the absence of any additional intermediate layer.

Direct bonding and reactive bonding may be performed at comparatively low temperatures such that the auxiliary carrier may be provided without significant impact on previously formed structures in the silicon carbide substrate.

In case the auxiliary carrier includes a metal, structurally connecting the auxiliary carrier at a front side of the silicon carbide substrate may include soldering, diffusion soldering, sintering and/or friction bonding. Diffusion soldering may include applying a diffusion solder material on the working surface of the auxiliary carrier and/or on the front side of the silicon carbide substrate, e.g., the front side metallization. The diffusion solder may include tin (Sn) and at least one further metal. For example, the diffusion solder may be lead-free and may include Sn and at least one of Ni, In, Pd, Mo, Cu, Au and Ag. Sintering may include application of a sinter paste on at least one of the working surface of the auxiliary carrier and the front side of the silicon carbide substrate, wherein the sinter paste may include at least one of silver and copper.

The auxiliary carrier may include a ring portion. The auxiliary carrier, in particular the ring portion of the auxiliary carrier, may be bonded to the silicon carbide substrate (e.g., via the front side metallization) without an adhesive layer. That is to say, the bond between the silicon carbide substrate and the auxiliary carrier and/or the ring portion of the auxiliary carrier may be free of an adhesive layer. For example, thermal bonding may be utilized for an adhesive-layer-free bond.

The auxiliary carrier may form a mechanically stabilizing carrier for the silicon carbide substrate, for example during processes applied at wafer level. Hereinafter, "mechanically stabilizing" means that the silicon carbide substrate may be handled in subsequent process steps with appropriate tools without the need for a further carrier, for example, to prevent breakage or bending of the silicon carbide substrate and/or to ease handling. In at least one method step, the auxiliary carrier may be the only mechanically stabilizing structure for the silicon carbide substrate. For example, the auxiliary carrier may stabilize the silicon carbide substrate during a wafer thinning process.

The idle layer may be removed. Removal of the idle layer includes a wafer thinning process, for example, grinding the silicon carbide substrate from the backside or splitting off the idle layer from the device layer.

Since the auxiliary carrier may mechanically stabilize the silicon carbide substrate after the wafer thinning process and/or up to die separation, the thickness of the silicon carbide substrate may be reduced. The thickness of the silicon carbide substrate may be reduced to a thickness below 0.3% (or below 0.2% or below 0.15%) of the diameter of the silicon carbide substrate. For example, the thickness may be reduced to below 180 µm, for example, to below 110 µm, to below 90 µm or to at most 70 µm. The final thickness may depend on the diameter of the silicon carbide substrate. For example, if the silicon carbide substrate has a diameter of 6 inch, the thickness may be reduced to below 110 µm.

A mold structure is formed. The mold structure fills a grid-shaped groove that laterally separates the device regions in the device layer. The grid-shaped groove may be formed in a portion of the kerf region in a dicing process prior to removing the idle layer or after removing the idle layer.

The mold structure may be formed from a material consisting of or including a glass (e.g. a low-melting glass with a glass transition temperature below 500° C.), a ceramic material, or a polymer-based material. For example, the mold structure may include silicone, polyimide, epoxy resin and/or polytetrafluoroethylene, wherein processes and tools for wafer level packaging technologies such as eWLB (embedded wafer level ball-grid-array) packaging may be used to form the mold structure in a cost-effective way.

In a substrate with a planar surface, the grid-shaped groove may include a set of first parallel stripe grooves and a set of second parallel stripe grooves intersecting the first stripe grooves at an angle greater 0 degree, e.g., at least 45 degrees, at least 80 degrees and/or at 90 degrees, i.e., orthogonally. The first and second stripe grooves may have the same depth. Substrate portions between pairs of neighboring first stripe grooves and pairs of neighboring second stripe grooves may form mesas protruding from the groove bottom plane, wherein coplanar horizontal cross-sections of the mesas may have the same shape and area. Alternatively, the grid-shaped groove may define hexagonal substrate portions.

After dicing, each device region forms a single semiconductor die, wherein the auxiliary carrier and the semiconductor dies form a wafer composite in which the semiconductor dies are at their original positions.

Forming the mold structure may include injection molding and/or a mold process using a two-piece mold. The backside of the silicon carbide substrate may function as a first mold piece. A flat mold piece placed at a distance to the backside of the silicon carbide substrate may function as a second mold piece. The space between the silicon carbide substrate and the flat mold piece is filled with a liquid mold resin that also fills the grid-shaped groove. After solidification and/or curing, the mold resin forms a rigid mold structure.

The mold structure may hold the already diced device regions at the positions the device regions had relative to each other prior to dicing. The device regions may still be fixed to the auxiliary carrier directly after the molding process. The wafer composite including the mold structure and the diced device regions allows further processing on wafer level, e.g., a wafer level packaging process like eWLB packaging.

The mold structure may include only the portion of the mold resin in the grid-shaped groove. The mold structure may form a rigid auxiliary grid laterally embedding each of the device regions. The auxiliary grid may facilitate application of further processes on wafer level, for example, device characterization. The device characterization (e.g., die sort and/or electrical sort) may include electric tests for each semiconductor die.

Then, the device regions may be separated from each other, wherein parts of the mold structure form frame structures that laterally surround the device regions. Separation may involve separating and/or removing parts of the mold structure. The parts of the mold structure that form the frame structure may be remaining parts and/or residues of the mold structure. Separation of the already diced device regions (i.e., the semiconductor dies) from each other may include standardized sawing processes that cut only through the mold structure. The method avoids mechanical contact of a saw (or a similar mechanical, abrasive tool) with sidewalls of the semiconductor dies. Chipping of semiconductor material along sidewalls of the semiconductor dies can be effectively avoided and process yield increased.

The frame structure from the mold material may form a form-fitting shell in direct contact with the sidewalls of the semiconductor die and may effectively protect the semiconductor die against humidity, contamination and electric charges. Further, the frame structure may increase device reliability.

According to an embodiment the groove may be formed prior to removing the idle layer. The groove may be formed after or during forming functional circuits in the device regions. For example, the groove may be formed prior to or after forming a front side metallization on the main surface of the silicon carbide substrate. Typically, the grooves are formed after structuring the front side metallization. The groove may reduce mechanical stress and/or bowing of the semiconductor substrate. A depth of the groove in the silicon carbide substrate may be equal to or greater than the final vertical extension of the semiconductor dies.

The groove may be at least partly filled with a layer or a layer system including at least one material that can be removed with high selectivity against the material of the silicon carbide substrate, for example, epoxy resin, BCB (benzocyclobutene, $C_8H_8$), PNB (polynorbornene), SOS (spin on silicon), SOG (spin on glass) or a doped or undoped glass.

According to another embodiment the groove may be formed after removing the idle layer. In this way it is possible that the device layer shows high mechanical stability during removal of the idle layer.

According to an embodiment the device regions may be remounted and/or redistributed prior to molding such that at least one of the device regions of the silicon carbide substrate is replaced with a supplementary device region obtained from a further semiconductor substrate. For example, the further device region may include electronic elements with a different electrical function than electronic elements formed in the device regions of the silicon carbide substrate.

Conductive lines may be formed in and/or on the mold structure. The conductive lines may electrically connect conductive structures of a device region from the silicon carbide substrate and conductive structure of a device region from the further semiconductor substrate. For example, semiconductor dies with different functionality and/or derived from different semiconductor materials may be combined in one single mold structure. A finalized hybrid semiconductor device includes semiconductor dies obtained from at least two different semiconductor substrates, wherein a separation portion of the mold structure laterally separates the at least two semiconductor dies from each other and a frame structure forms a common frame around all semiconductor dies of the hybrid semiconductor device. Accordingly, more than one of the device regions may be replaced with supplementary device regions, wherein different types of supplementary semiconductor dies may be used.

According to an embodiment, after forming the mold structure and prior to separating the device regions, backside metal structures may be selectively formed on a backside surface of the device regions. The backside metal structures are not formed on the mold structure (i.e., the mold structure may be free of the backside metal structures). Instead, the mold structure may support a self-aligned formation of at least a portion of the backside metal structure or may provide a flat surface for a pattern plating process that forms at least a portion of the backside metal structure.

According to an embodiment, a preform may be provided for forming the mold structure. The preform may be provided prior to molding or during molding as part of the molding cast. The preform may include laterally separated stencil portions on the backside surface of the device regions, wherein each stencil portion is assigned to one device region. The preform may further include a framing portion that forms a closed frame laterally surrounding the stencil portions. When the mold structure is formed, the mold structure fills a space between the stencil portions and between the stencil portions and the framing portions.

In this way it is possible that the mold structure is exclusively formed directly below the kerf region with the grid-shaped groove. The mold structure is absent directly below the device regions. The preform may facilitate the self-aligned formation of at least a portion of a thick backside metallization.

According to an embodiment, the preform may be removed after the mold structure is formed. Removing the stencil portions of the preform selectively exposes the backside surface of the device regions and facilitates self-aligned formation of at least a portion of a thick backside metallization.

According to an embodiment, at least a portion of the backside metal structures is formed in spaces left after removing the stencil portions of the preform.

For example, a metal paste may be applied and a squeegee may remove the excess metal paste from the surface of the stencil portions. A baking process may dry the metal paste to form solid and compact backside metal structures from the metal paste.

According to an embodiment, a metal seed layer may be formed on the diced device layer prior to applying the preform. The metal seed layer covers the backside surface and sidewalls of the device regions. Prior to forming the main metal portion, the auxiliary carrier may be removed, wherein the metal seed layer becomes accessible at the front side of a wafer composite that includes the mold structure and the diced device regions. On the backside of the wafer composite, spaces left by removal of the stencil portions of the preform expose sections of the metal seed layer formed on the backside surface of the device regions. An electrochemical deposition process may form thick main metal portions of the backside metal structures that selectively grow on portions of the exposed portions of the metal seed layer on the backside of the device regions.

According to an embodiment, the metal seed layer may include an access portion formed on the side of the auxiliary carrier oriented to the device regions. The access portion may extend outwardly from the outermost device regions. For example, the access portion may form a ring, a ring segment or a plurality ring segments along an outer perimeter of the auxiliary carrier.

The mold structure may be formed such that the access portion remains exposed and accessible for an electric potential applied during electrochemical deposition of the main metal portions. In this way it is possible that the auxiliary carrier mechanically stabilizes the wafer composite also during electrochemical deposition of the main metal portions. The auxiliary carrier may be removed after forming the main metal portions.

According to an embodiment, a layer portion of the mold structure, which may be formed outside the grid-shaped groove, is removed such that the backside surface of laterally separated device regions is exposed. The device regions and the mold structure in the groove form a flat rear side surface.

According to an embodiment, a metal seed layer may be formed on a backside surface of the device regions after removing the layer portion of the mold structure. Laterally separated main metal portions of the backside metal structures may be formed on the metal seed layer. Forming the main metal portions may include pattern plating, wherein the main metal portions are formed in a self-aligned manner.

According to an embodiment, a front side metallization may be formed on the main surface of the silicon carbide substrate prior to structurally connecting the auxiliary carrier and the silicon carbide substrate. In this way it is possible that forming the front side metallization is part of the front side processing of the device regions.

For example, it is possible that the further processes up to device separation apply only temperatures below 500 degree Celsius such that even a front side metallization formed prior to providing the auxiliary carrier may include aluminum (Al).

The front side metallization may be formed in a single piece or may include a plurality of separated portions. The separated portions may be formed in a multi-sectional and/or in a multi-piece manner. Here and in the following, an element or portions of said element being formed in a "multi-sectional manner" may mean that the portions of the element are connected via bridges, which may be smaller than said portions. A top face of a "multi-sectional" element may be coherent, but not simply coherent. For example, a "multi-sectional" element may include holes and/or gaps between the portions of said element. Further, here and in the following, an element or portions of said element being formed in a "multi-piece manner" may mean that the portions are free of an interconnection, i.e., the portions are separated from one another. A top face of a "multi-sectional" element may not be coherent. If portions of an element are formed "multi-sectional" and "multi-piece" at the same time, said element may include a first part with first portions being formed in a multi-sectional manner and a second part with second portions being formed in a multi-piece manner, wherein the first part and the second part may be formed in a multi-piece manner with one another. Each part of the front side metallization may be assigned to a device region in a one-to-one manner.

Providing the front side metallization at an early stage may also facilitate device characterization with the semiconductor dies being members of a wafer composite after removal of the auxiliary carrier.

According to another embodiment, the front side metallization may be formed on the main surface of the silicon carbide substrate after separating the auxiliary carrier and the silicon carbide substrate. In this way it may be possible to form the front side metallization independently from the temperature budget applied during and/or after wafer thinning. In other embodiments, the front side metallization may be formed before separating the auxiliary carrier and the silicon carbide substrate and/or before wafer thinning and/or before formation of the backside metal structures. For example, the front side metallization may include aluminum or copper and the processes applied to the wafer composite until removal of the auxiliary carrier are not restricted to maximum temperatures of 500° C.

According to an embodiment, removing the idle layer includes splitting off the idle layer from the device layer. Throughout this application, splitting off a layer portion of the silicon carbide substrate (e.g., the idle layer from the device layer) may also be called "split-off method". The split-off idle layer may be reused for the manufacturing of further semiconductor devices. Thereby, a plurality of thin silicon carbide substrates may be obtained from one single standard silicon carbide wafer.

The idle layer may be split off from the device layer along a splitting region. The splitting region may be a layer in the silicon carbide substrate that differs by at least one physical property and/or material property from the rest of the silicon carbide substrate. The "rest of the silicon carbide substrate" may be the part of the silicon carbide substrate that is free of the splitting region and that surrounds the splitting region. For example, the splitting region may have a different absorption coefficient (e.g., a higher absorption coefficient), a different band gap (e.g., a lower band gap), a different porosity (e.g., a higher porosity), a different mechanical stability, a different material composition, and/or a different crystal structure (e.g., a different poly-type and/or a different crystallinity) than the rest of the silicon carbide substrate. For example, the splitting region may comprise ions that have been implanted into the silicon carbide substrate and/or porous silicon carbide. The splitting region may have a thickness that is small compared to the thickness of the silicon carbide substrate. A lateral extent of the splitting region may be at least 90%, or at least 95%, of the lateral extent of the silicon carbide substrate. In other words, the splitting region may laterally extent substantially along the entire silicon carbide substrate.

The split-off method may be a laser-assisted split-off method. That is to say, the split-off method may involve applying laser radiation to the silicon carbide substrate (i.e., irradiating the silicon carbide substrate with laser radiation). The laser radiation may create a splitting region in the silicon carbide substrate and/or may be applied to a splitting region in the silicon carbide substrate.

If the laser radiation is to be applied to a splitting region, the splitting region may have a higher absorption coefficient for a wavelength of the laser radiation than the rest of the silicon carbide substrate. For example, the absorption coefficient in the splitting region is at least 5 times, or at least 20 times or at least 100 times, higher than an absorption coefficient in the rest of the silicon carbide substrate.

A splitting region with a higher absorption coefficient may be provided by implanting ions into the silicon carbide substrate. The ions may result directly in higher absorption, e.g. due to higher absorption rate at the ions, and/or may lead to conversion of the crystal structure of the silicon carbide substrate into a different poly-type (e.g., from 4H—SiC to 3C—SiC) and/or into a different crystallinity, such that the absorption coefficient for the laser radiation is increased in the splitting region. By applying laser radiation to the splitting region, thermo-mechanical stress may be created along the splitting region, which may facilitate and/or simplify removal of the idle layer.

The laser radiation that is to be applied to the splitting region may be in the resonant regime, where single-photon processes (e.g., single-photon absorption) dominate, i.e., a probability of multi-photon processes is small (e.g. at least ten times smaller than the probability of a single-photon process). In the resonant regime, the band gap of the splitting region may, for example, be at most ten times (typically at most twice) the photon energy of the laser radiation. The laser radiation may be absorbed in the splitting region and may lead to damage of the splitting region, such that no or only a small mechanical force and/or thermal stress is required for splitting the silicon carbide substrate. In the resonant regime, the laser-assisted split-off method may also be called laser lift-off.

If the splitting region is created by laser radiation, the splitting region may be defined by focusing laser radiation to a well-defined region (e.g., a region with the thickness of the splitting region) within the silicon carbide substrate. In this case, the laser radiation may be in the off-resonant regime, such that a probability of single-photon processes in the splitting region is essentially zero, and only multi-photon processes (e.g., multi-photon absorption) may have to be taken into account. For example, the off-resonant regime may be achieved if the band gap of the splitting region is at least twice (typically at least ten times) the photon energy of the laser radiation. Applying laser radiation, e.g. by focusing the laser radiation to a well-defined region, in the off-resonant regime may result in creation of a perforation plane (which may correspond to the splitting region). In this case, the laser-assisted split-off method may also be called laser conditioning. Within the perforation plane, thermo-mechanical stress may be increased compared to the rest of the silicon carbide substrate, thus simplifying splitting the silicon carbide substrate, e.g. by applying mechanical force and/or thermal stress to the silicon carbide substrate.

According to an embodiment, a silicon carbide substrate may be provided that includes a plurality of device regions and a grid-shaped kerf region laterally separating the device regions. A mold structure may be formed on a backside surface of the kerf region. Backside metal structures are formed on a backside surface of the device regions. The device regions are separated, wherein parts of the mold structure form frame structures that laterally surround the backside metal structures.

According to another embodiment, a semiconductor device may include a silicon carbide body, a first load electrode at a front side of the silicon carbide body and a second load electrode at a backside of the silicon carbide body. A frame structure that may include a polymer-based material is in contact with a sidewall of the silicon carbide body and laterally completely surrounds at least the silicon carbide body. The frame structure may cover the sidewall of the silicon carbide body along the complete vertical extension of the silicon carbide body. The frame structure may be absent above the first load electrode.

The polymer-based material may consist of or include at least one of silicone, epoxy resin, polyimide and polytetrafluoroethylene. According to another embodiment the frame structure may include a ceramic material or a glass, e.g., a low-melting glass with a glass transition temperature below 500° C.

In general, a polymer-based material may be used as a material for the frame structure. The material of the frame structure may be chosen according to at least one of the following properties: density, long-term stability, mechanical strength. Processes and tools for wafer level packaging technologies such as eWLB may be used to form the frame structure in a cost-effective way.

The frame structure may provide a closed, form-fit sleeve that effectively protects the silicon carbide body against humidity and contamination, e.g. contamination with charged ions, electrons, and/or against contamination with uncharged particles. In addition, the frame structure may facilitate a simple, reliable and cost-effective separation of the semiconductor device from a wafer composite.

According to other embodiments, the semiconductor device may include a semiconductor body from another semiconductor material, e.g., silicon, germanium, or another wide-bandgap material, such as gallium nitride (GaN), aluminum nitride (AlN) or gallium oxide ($Ga_2O_3$).

According to an embodiment, the silicon carbide body may include a first doped region and a second doped region, wherein the first doped region and the second doped region may form a pn junction and/or may directly adjoin each other. The first load electrode may be in contact with the first doped region. The second load electrode may be in contact with the second doped region. The frame structure may effectively protect the silicon carbide body of vertical power semiconductor devices against contamination and humidity.

According to an embodiment, the material forming the frame structure may include at least one of: an epoxy resin, a polyimide, polytetrafluoroethylene, silicone. Processes and tools for wafer level packaging technologies such as eWLB may be used to form the frame structure in a cost-effective way.

According to an embodiment, the frame structure may laterally surround the second load electrode. The frame structure may form a one-piece form-fit sleeve wrapping around both the silicon carbide body and the second load electrode. The frame structure may thus also effectively protect the edge between silicon carbide body and second load electrode against humidity and contamination.

According to an embodiment, the semiconductor device may further include a terminal, a bond wire/metal clip electrically connecting the terminal and the first load electrode and a mold body that encapsulates the bond wire/metal clip. The materials of the mold body and the frame structure are different. Methods and materials from the field of wafer level packaging technology such as eWLB may be combined with IC package technologies to improve overall device reliability.

FIGS. 1A-1D illustrate a method that includes forming a mold structure in a grid-shaped groove laterally separating device regions of a device layer.

FIG. 1A shows a wafer assembly 900 that includes a silicon carbide substrate 700 and an auxiliary carrier 680. Other embodiments may relate to a wafer assembly 900 in which the silicon carbide substrate 700 is replaced with another semiconductor substrate, which may be based on another wide-bandgap semiconductor material such as gallium nitride (GaN), aluminum nitride (AlN) or gallium oxide ($Ga_2O_3$).

The silicon carbide substrate 700 may be a flat plate with a diameter that corresponds to the diameter of a standard wafer size, for example 2-inch (51 mm), 3-inch (76 mm), 4-inch (100 mm), 125 mm, or 200 mm. A cross-section of the silicon carbide substrate 700 may be elliptical (in particular circular) or polygonal (in particular hexagonal). The silicon carbide substrate 700 may be based on a silicon carbide crystal including silicon and carbon as main constituents. The silicon carbide crystal may include further materials, for example, unintentional impurities as a result of material and process imperfections and/or intentional additives. Unintentional impurities may include oxygen. Intentional additives may include hydrogen and/or dopant atoms, e.g., nitrogen (N), phosphorus (P), beryllium (Be), boron (B), aluminum (Al), and/or gallium (Ga). A surface normal 704 on a main surface 701 at a front side of the silicon carbide substrate 700 defines a vertical direction. Directions orthogonal to the surface normal 704 are lateral directions (sometimes also referred to as "horizontal directions").

A thickness of the silicon carbide substrate 700 between the main surface 701 and a backside surface 702 of the silicon carbide substrate 700 may be equal to or smaller than a thickness of a standard silicon carbide wafer for the same diameter. For example, the thickness may be smaller than 180 µm, smaller than 110 µm, smaller than 90 µm, or at most 70 µm.

The silicon carbide substrate 700 may include a device layer 750 and an idle layer 760. The device layer 750 adjoins the main surface 701. The idle layer 760 is formed between the device layer 750 and the backside surface 702.

The device layer 750 includes a plurality of laterally separated device regions 650. In other words, the device regions 650 are laterally spaced, e.g., by a groove, a structure of another material, or another portion of the device layer 750.

Each device region 650 may include a plurality of doped regions. For example, each device region 650 may include at least a first doped region 120, e.g., an emitter region, and a second doped region 130, e.g., a drift structure. The first doped region 120 and the second doped region 130 may form a pn junction pn. The first doped region 120 may include an anode region of a power semiconductor diode or may include body regions of an IGFET, MCD or IGBT. A groove 770 may laterally separate the device regions 650 from each other. In a horizontal cross-section, the groove 770 is grid-shaped. The groove 770 extends from the main surface 701 into the device layer 750 and may reach or may extend into the idle layer 760.

The groove 770 may be completely filled with a gas, e.g., with ambient air, or may be filled with a solid sacrificial material that may be easily removed with high selectivity against the material of the device regions 650. For example, the groove 770 may be partially or completely filled with an inorganic or an organic material. For example, at least one of the following materials may be used: resin, glass, polyimide, amorphous silicon, polycrystalline silicon, silicon oxide or any combination thereof.

An auxiliary carrier 680 is provided at the front side of the silicon carbide substrate 700. The auxiliary carrier 680 may be in direct contact with the main surface 701. Alternatively, a front side metallization, an interlayer dielectric and/or a passivation structure may be formed between the auxiliary carrier 680 and the main surface 701, wherein the interlayer dielectric may be formed between portions of the front side metallization and portions of the silicon carbide substrate 700, and wherein the passivation structure may cover edge portions of the front side metallization and/or the interlayer dielectric.

The auxiliary carrier 680 may have the shape of a plate of uniform thickness or the shape of a ring that extends along the perimeter of the silicon carbide substrate 700. Alternatively the auxiliary carrier 680 may be a plate with a plurality of openings above the device regions 650.

For example, the auxiliary carrier 680 may be or may include a metal plate. Alternatively, the auxiliary carrier 680 may be formed by press-molding, wherein a source material pressed against the silicon carbide substrate 700 is temporarily heated above the glass transition temperature of the source material. The auxiliary carrier 680 may be formed with openings that expose sections of the front side metallization on the device regions 650.

The auxiliary carrier 680 may include a main carrier 682, e.g., a semiconductor plate, an insulator plate or a metal plate, attached to the front side of the silicon carbide substrate 700 through an adhesive layer 681. The adhesive layer 681 adhesion bonds the main carrier 682 onto the silicon carbide substrate 700 or onto the front side metallization. The adhesive layer 681 may be formed from a temporary bonding/debonding adhesive. For example, liquid glue (i.e., a liquid adhesive) may be applied onto the front side of the silicon carbide substrate 700. A pre-bake may dry and/or cure the glue and/or remove the solvent. Separately or in combination, the liquid adhesive may be dried and/or cured and/or transformed by illuminating the glue with or an electromagnetic radiation (e.g. UV radiation) to the adhesive. Curing may also be achieved by waiting a sufficient amount of time. The main carrier 682 may be brought into contact with an exposed top surface of the glue. Then, the glue may be cured or further cured to form the adhesive layer 681 as described above.

Alternatively, the adhesive layer 681 may be or may include an adhesive tape that adhesion bonds the main carrier 682 and the semiconductor substrate 700. The adhesive layer 681 forms a reversible connection between the main carrier 682 and the silicon carbide substrate 700 such that after separation of the auxiliary carrier 680 from the silicon carbide substrate 700 the auxiliary carrier 680 may be reused.

Alternatively, the auxiliary carrier 680 and the semiconductor substrate 700 may be irreversibly bonded to each other to reduce bowing of the silicon carbide substrate 700. Removal of an irreversibly bonded auxiliary carrier 680 may include a grinding or polishing process that consumes at least the auxiliary carrier 680 partly or completely. Irreversible bonding may be anodic bonding, e.g. between a glass or polycrystalline silicon and silicon, a silicon direct bonding (Si—Si), fusion bonding (Si—O-O—Si, SiN). An irreversibly bonded auxiliary carrier 680 may reduce wafer bowing of the silicon carbide substrate 700 in the following processes.

The idle layer 760 is removed. Removal of the idle layer 760 may include grinding and/or a wafer split process as described above.

FIG. 1B shows that removal of the idle layer 700 may expose the grid-shaped groove 770 and the backside surface 652 of the device regions 650. If applicable, a temporary fill of the groove 650 may be removed. A thin passivation layer and/or a thin metallization layer may be deposited that may cover sidewalls 653 and a backside surface 652 of the device regions 650 at approximately uniform thickness. A mold structure 400 is formed that at least fills the groove 770.

FIG. 1C shows a mold structure 400 in the groove 770. The mold structure 400 may directly adjoin the sidewalls 653 of the device regions 650. According to other embodiments, a thin passivation layer and/or a thin metal seed layer may be formed between the sidewalls 653 of the device regions 650 and a portion of the mold structure 400 in the groove 770. The mold structure 400 may be formed from a mold material that may consist of or include glass, ceramic or a polymer-based material. For example, the mold material is a mold compound as used for wafer level packaging technologies like eWLB (embedded wafer level BGA packaging). For example, the mold material may include an epoxy resin and/or another polymer-based material.

The mold structure 400 may be formed exclusively in the groove 770 or may include a layer portion covering the backside surface 652 of the device regions 650. In the latter case, the layer portion of the mold structure 400 may be removed to expose the backside surface 652 of the device regions 650. One or more implants may form one or more doped layers in the device regions 650 along or close to the backside surface 652. Backside metal structures (not illustrated) may be formed on the backside surface 652 of the device regions 650.

The auxiliary carrier 680 may be removed, e.g., by releasing reversible bonds in the adhesive layer 681 or by stripping, e.g., by grinding, an irreversibly bonded auxiliary carrier 680.

Before or after removing the auxiliary carrier 680, the device regions 650 may be attached onto a separation tape 960. A separation process may cut through the molding structure 400. The separation process may include dicing (e.g., mechanical dicing or laser dicing), grinding and/or another mechanical abrasive process, by way of example.

FIG. 1D shows the separated semiconductor dies 950 arranged side by side on the separation tape 960. Each semiconductor die 950 includes a device region 650 with a frame structure 480 formed from remaining parts of the mold structure 400. Each frame structure 480 laterally surrounds one device region 650 along the complete vertical extension in a form-fitted manner.

Figure 2B:
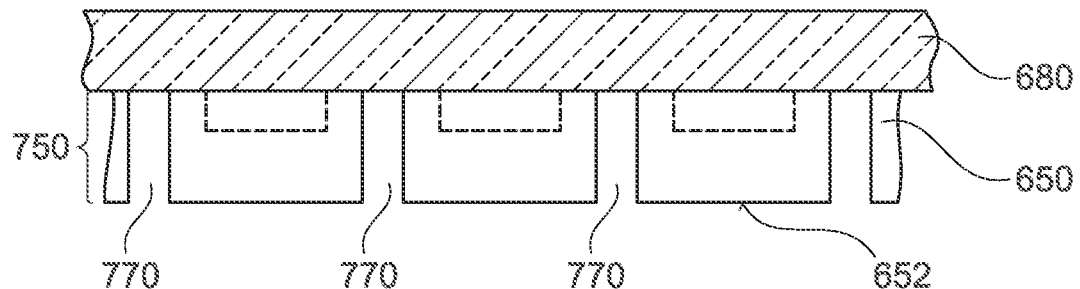

FIGS. 2A-2B illustrate a process with the groove 770 formed after removal of the idle layer 760 from the device layer 750.

The device layer 750 between the main surface 701 and the idle layer 760 includes a plurality of device regions 650 and a grid-shaped kerf region 660 that laterally separates the device regions 650 from each other. The auxiliary carrier 680 may be any of the ones described with reference to FIG. 1A.

A grinding process or any of the above described wafer split methods may remove the idle layer 760. Then the grid-shaped groove 770 is formed in the kerf region 660.

A redistribution process for redistributing at least some of the device regions 650 may be inserted between exposing the grid-shaped groove 770 as illustrated in FIGS. 1B, 2B and forming the mold structure 400 of FIG. 1C, wherein the auxiliary carrier 680 of FIG. 1C is not necessarily the same as in FIG. 1B or 2B and wherein the separation process may separate groups of device regions from each other.

FIGS. 3A-3D show a redistribution process that may be inserted between FIGS. 1B and 1C.

Figure 3A:
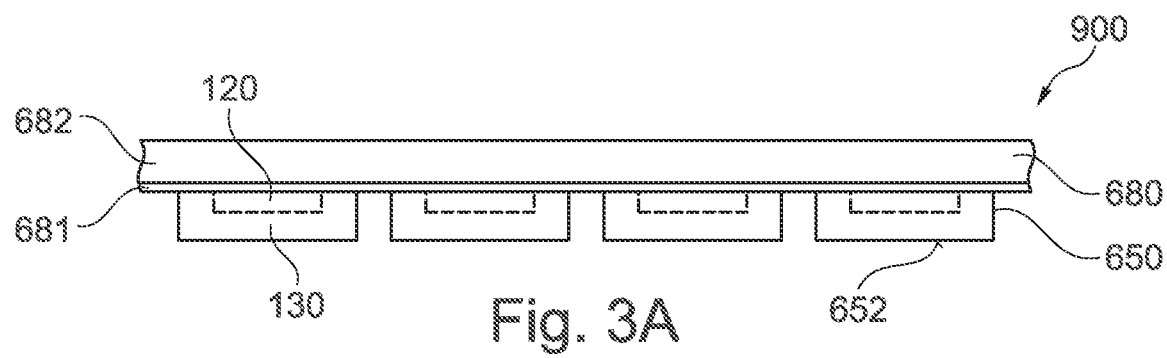
FIGS. 3A-3D show schematic cross-sectional views of a wafer assembly for illustrating a method of forming semiconductor devices according to an embodiment including a re-distribution of device regions prior to molding.

FIG. 3A shows a wafer assembly 900 with an auxiliary carrier 680 structurally connected to a plurality of device regions 650, wherein a grid-shaped groove 770 laterally separates the device regions 650. A redistribution carrier 550 may be connected to the backside surface 652 of the device regions 650. Then the auxiliary carrier 680 may be removed.

Figure 3B:
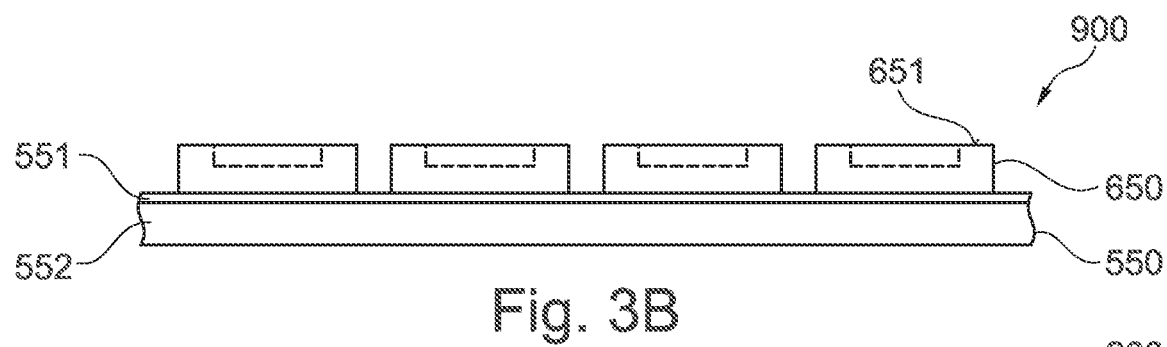

FIG. 3B shows the device regions 650 fixed on a surface of the redistribution carrier 550. The redistribution carrier 550 may include a main part 552 and an adhesion layer 551 that adhesion bonds the main part 552 and the device regions 650. The main part 552 may be mechanically rigid.

The main carrier 552 and adhesive layer 551 of the redistribution carrier 550 may have any of the configurations as described above for the main carrier 682 and adhesive layer 681 of the auxiliary carrier 680. A pick-and-place process may locally debond selected ones of the device regions 650 from the redistribution carrier 550. For example, a local heat treatment or a local treatment with radiation of a suitable wavelength may locally deactivate the bonds in the adhesion layer 551 and the concerned device regions 650 can be picked up from the redistribution carrier 550. Supplementary device regions 655 may be placed in the spaces left by the removed device regions 650.

Figure 3C:
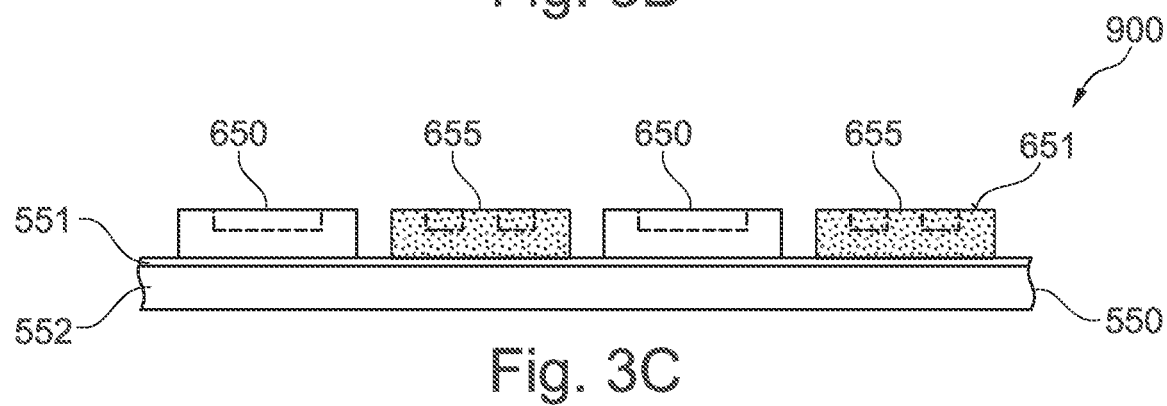

FIG. 3C shows the wafer assembly 900 after redistribution. Each second device region 650 of FIG. 3B may be replaced with a supplementary device region 655. An auxiliary carrier 680 as described with reference to the previous figures may be provided at the front side of the device regions 650 and supplementary device regions 655. The redistribution carrier 550 may be removed. A molding structure 400 may be formed as described with reference to FIG. 1C.

Figure 3D:
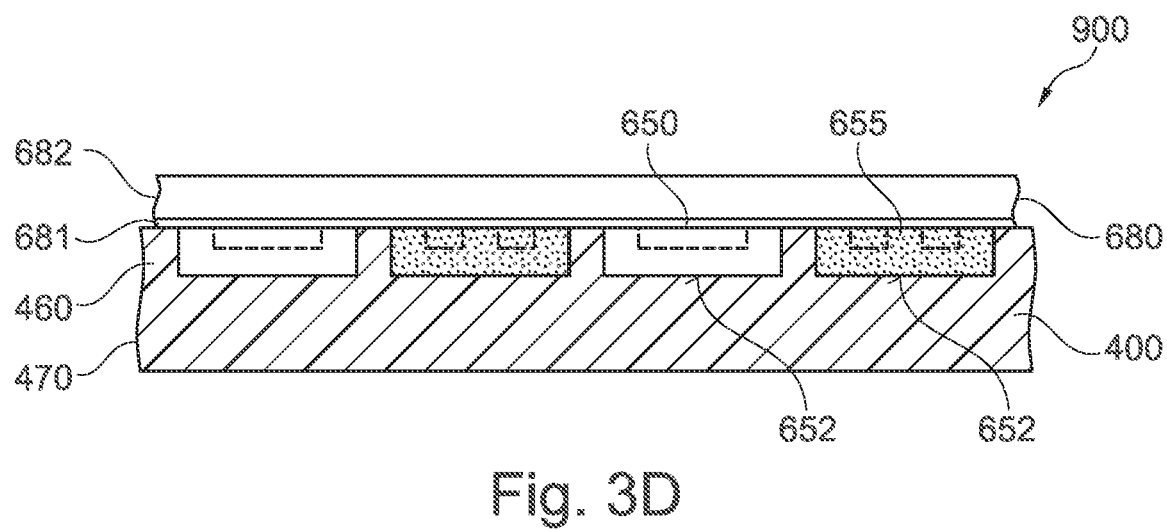

FIG. 3D shows a wafer assembly 900 with device regions 650 obtained from a first semiconductor substrate, e.g., the silicon carbide substrate 700 of FIGS. 1A, 2A, and supplementary device regions 655 obtained from a further semiconductor substrate placed side by side on a surface of the auxiliary carrier 680, which is attached to the front side of the device regions 650 and supplementary device regions 655. The mold structure 400 includes a groove portion 460 and a layer portion 470. The groove portion 460 fills spaces between the device regions 650 and supplementary device regions 655. The continuous layer portion 470 is formed on the backside surface 652 of the device regions 650 and supplementary device regions 655.

The method facilitates formation of interconnections between neighboring device regions 650, 655 on wafer level and further facilitates the manufacturing of hybrid devices that include device regions from at least two different semiconductor substrates.

FIGS. 4A-4D illustrate the formation of hybrid devices on the basis of the wafer assembly 900 of FIG. 3D. The auxiliary carrier 680 of FIG. 3D may be removed after forming the mold structure 400.

Figure 4A:
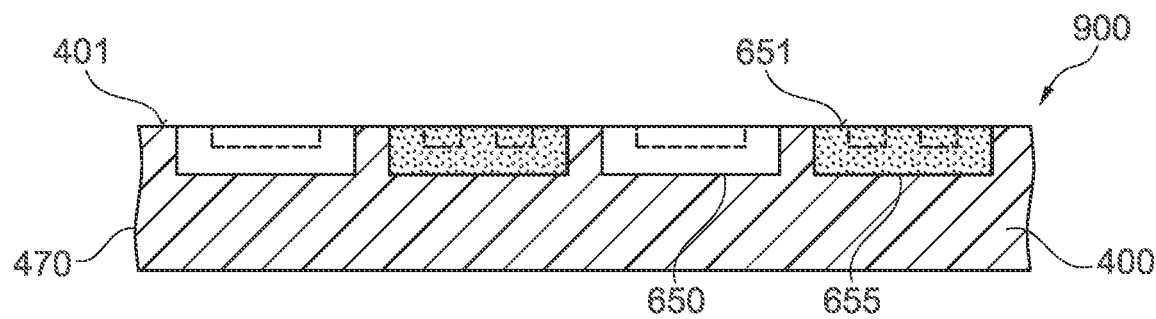
FIGS. 4A-4D show schematic cross-sectional views of a wafer assembly for illustrating a method of forming hybrid semiconductor devices according to another embodiment.

FIG. 4A shows a wafer assembly 900 with a mold structure 400 that laterally embeds the device regions 650 and supplementary device regions 655. The mold structure 400 includes a layer portion 470 that is sufficiently thick to mechanically stabilize the wafer assembly 900 for the following processes.

An insulating layer may be deposited at the front side of the wafer assembly 900. A lithography process performed in a lithography apparatus, which is equipped for the exposure of semiconductor wafers, may pattern the insulating layer, wherein remaining portions of the insulating layer may form an interlayer dielectric 605.

Figure 4B:
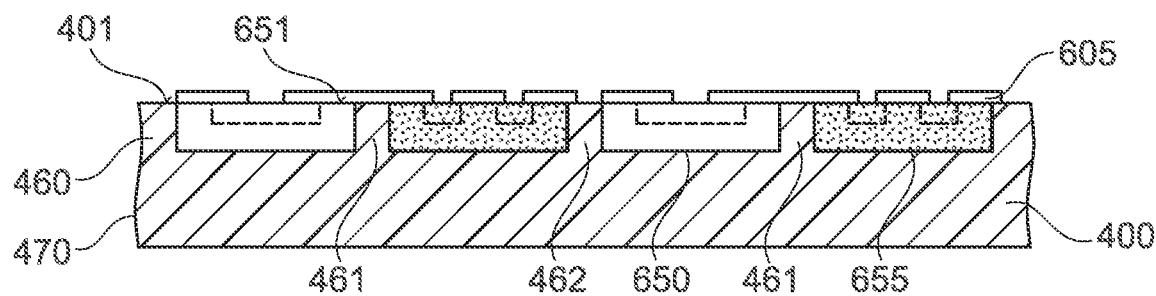

FIG. 4B shows the interlayer dielectric 605 formed on a process surface 401 at a front side of the wafer assembly 900. The process surface 401 includes first sections formed from the mold structure 400 and second sections formed from the front side surface 651 of the device regions 650 and supplementary device regions 655. Openings in the interlayer dielectric 605 may expose conductive structures, for example heavily doped regions in the device regions 650 and supplementary device regions 655.

The interlayer dielectric 605 may extend across first groove portions 461 of the mold structure 400. The interlayer dielectric 605 may extend across second mold portions 462 or may be absent above the second mold portions 462. One or more conductive materials may be deposited, wherein the conductive material(s) may fill the openings in the interlayer dielectric 605. A further lithography process may pattern the deposited conductive material(s) to form at least a portion of a front side metallization 610.

Figure 4C:
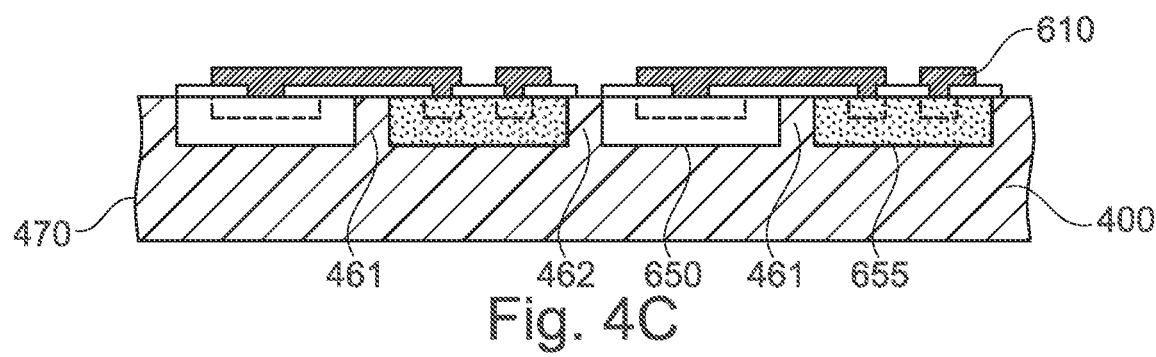

According to FIG. 4C the front side metallization 610 may include several laterally separated sections for different electric signals and/or different electric potentials. Each section of the front side metallization 610 may be electrically connected to at least one conductive structure in one of the device regions 650 and supplementary device regions 655. At least one section of the front side metallization 610 may form a conductive line that is electrically connected to a conductive structure in a device region 650 and to a conductive structure in a supplementary device region 655, wherein the conductive line spans across the first mold portion 461. No conductive lines span across second mold portions 462.

On the front side metallization 610 a further passivation layer may be deposited and patterned and a further wiring plane of the front side metallization 610 may be formed. Alternatively or in addition, the front side metallization may be formed with solder structures, for example, solder balls and/or with a power metallization structure.

A separation process as described with reference to FIG. 1D may separate groups of two, three or more different device regions 650 and supplementary device regions 655 from each other. The separation process only cuts through the second mold portions 462 such that the separation process is effective only in the mold material.

Figure 4D:
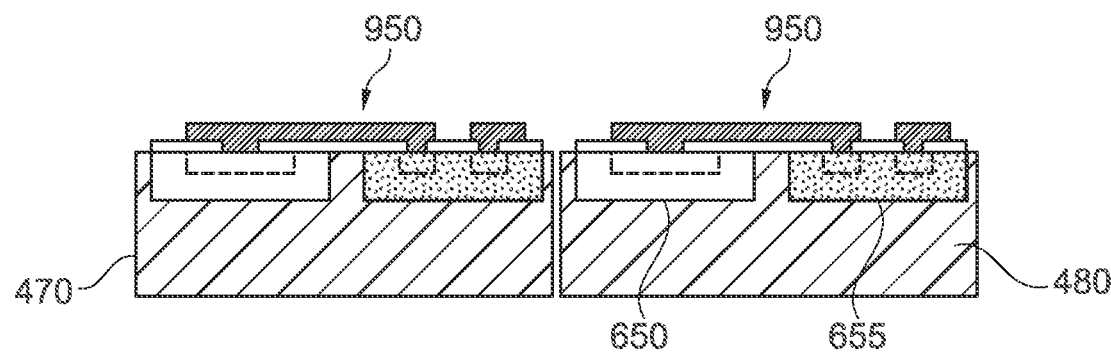

FIG. 4D shows separated semiconductor dies 950, wherein each semiconductor die 950 includes a device region 650 and a supplementary device region 655. Each semiconductor die 950 may be a hybrid chip including components of different semiconductor materials and/or different electrical functionality, for example a FET and a diode electrically connected in parallel to the load terminals of the FET.

The following figures refer to the formation of backside metal structures on the backside surface 652 of the device regions 650 of FIGS. 1A to 4D. A thickness of the backside metal structure may depend on the load conditions the semiconductor device is designed for, in particular on the maximum electric power dissipated in the semiconductor device during operation.

FIGS. 5A-5D use a preform 410 that includes laterally separated stencil portions 415, wherein the horizontal dimensions of the stencil portions 415 are adapted to the horizontal dimensions of the device regions 650 and wherein a center-to-center distance between the stencil portions 415 is equal to the center-to-center distance between the device regions 650. The preform 410 may be applied in an additional process before the molding or the preform 410 may be part of the molding cast that is used for forming the mold structure 400. The preform 410 may include a frame portion 419 surrounding the stencil portions 415. The frame portion 419 may form a closed frame, e.g., a ring along the perimeter of the auxiliary carrier 680. A mold material, e.g. a mold compound is filled in the space between the stencil portions 415 and within the frame portion 419.

Figure 5A:
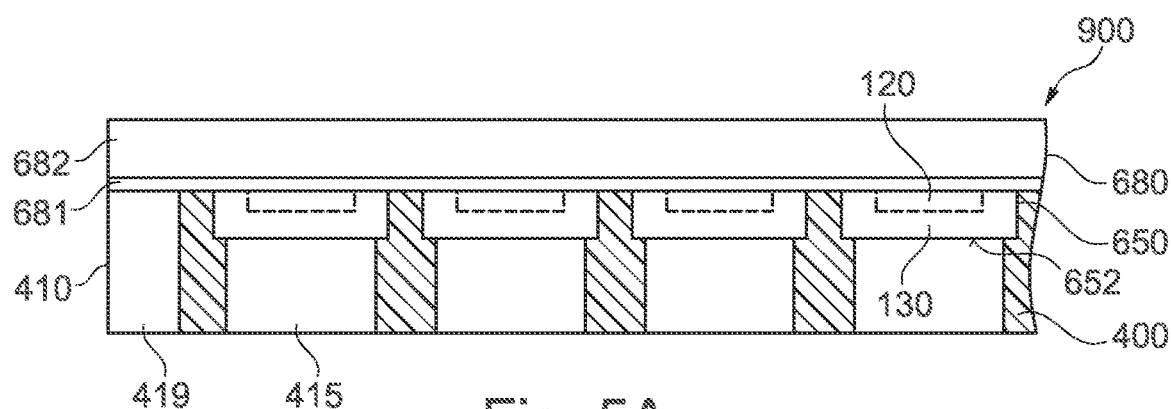
FIGS. 5A-5D show schematic cross-sectional views of a wafer assembly for illustrating a method of forming semiconductor devices according to an embodiment using a preform for molding.

FIG. 5A shows the mold structure 400 formed in the groove 770 of FIGS. 1B, 2B and in the space between the stencil portions 415 and the frame structure 419 of the preform 410. The preform 410 may be from the same material or from a similar material as the part of the mold that presses the mold compound into the groove 770. After solidification of the mold compound the preform 410 may be removed, for example, together with the molding cast.

Figure 5B:
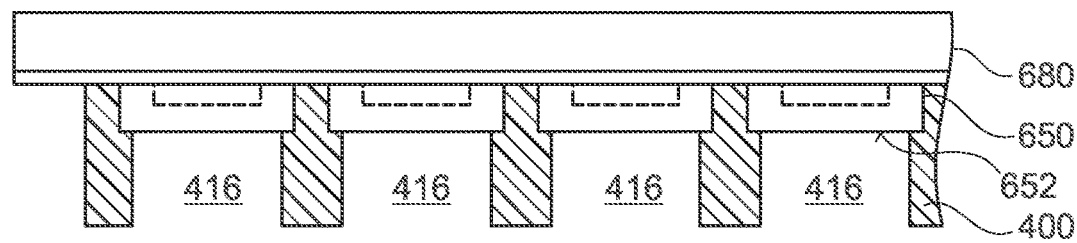

FIG. 5B shows spaces 416 left by the stencil portions 415 of FIG. 5A. The mold structure 400 forms a grid, wherein the grid fills the groove 770 of FIGS. 1B, 2B and protrudes from the backside surface 652 of the device regions 650. Openings in the mold structure 400 form spaces 416 exposing at least portions of the backside surface 652 of the device regions 650.

At least a portion of backside metal structures 320 is formed in each of the spaces 416 of FIG. 5B. For example, a metal paste may be coated with a squeegee, wherein the squeegee removes excess metal paste. A baking and/or sintering process may dry the metal paste to form a solid and compact backside metal structure 320. The baking and/or sintering process may involve one method step or several method steps. For example, the coating with the squeegee may be repeated several times, wherein after at least one or each of the coating steps, the metal paste may be dried and/or cured. Repeating the coating step several times may allow for filling up the spaces 416 with almost no voids in the backside metal structures 320. Alternatively or in addition, forming the backside metal structures 320 may include a stencil printing process, electrochemical deposition or electroless deposition of a metal.

Figure 5C:
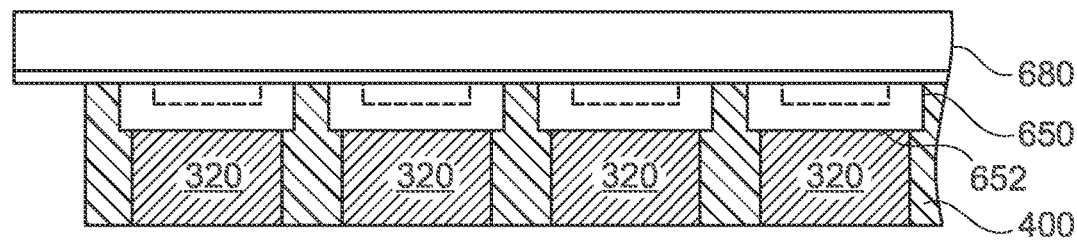

FIG. 5C shows the backside metal structures 320 formed on the backside surface 652 of the device region 650 in the openings of the mold structure 400. The device regions 650 are separated as described with reference to FIG. 1D.

Figure 5D:
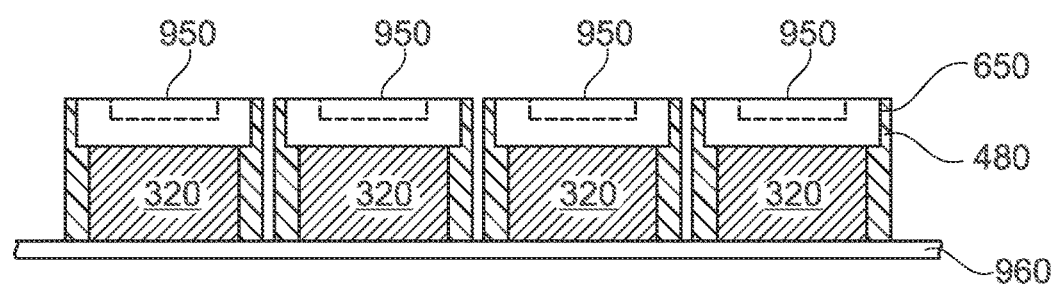

FIG. 5D shows that the separation process results in frame structures 480 that laterally embed the complete semiconductor die 950 including the device region 650 and a comparatively thick backside metal structure 320.

In FIGS. 6A-7D formation of the backside metal structure 320 of FIG. 5C includes electrochemical deposition of a metal, e.g., copper.

A metal seed layer 321 is formed on the device regions 650 of FIGS. 1B and 2B prior to forming the mold structure. The seed layer 321 may have a thickness of at least 30 nm and at most 500 nm.

Figure 6A:
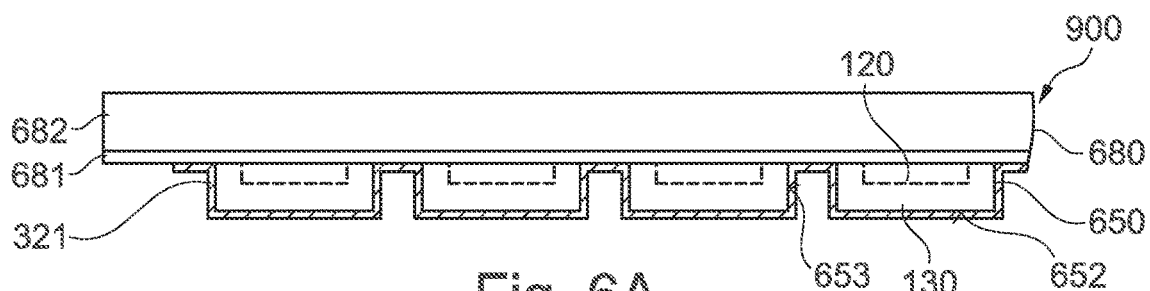
FIGS. 6A-6E show schematic cross-sectional views of a wafer assembly for illustrating a method of forming semiconductor devices according to an embodiment using a metal seed layer and a preform for molding.

FIG. 6A shows the metal seed layer 321 covering at approximately uniform thickness the backside surface 652 and the sidewalls 653 of the device regions 650. The metal seed layer 321 may include or consist of at least one of the following materials: Ti, W, N, Cu. The metal seed layer 321 may comprise a layer stack. Each layer of the layer stack may include or consist of at least one of the afore-mentioned materials. For example, the metal seed layer 321 may include a copper layer and at least one of a TiW layer, a TiN layer and a TiWN layer, wherein the layer comprising Ti may act as an adhesion promoter for the copper layer.

Figure 6B:
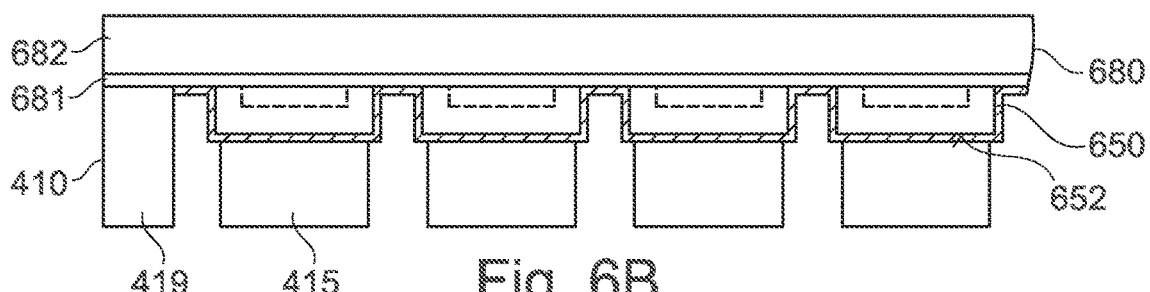
Figure 6C:
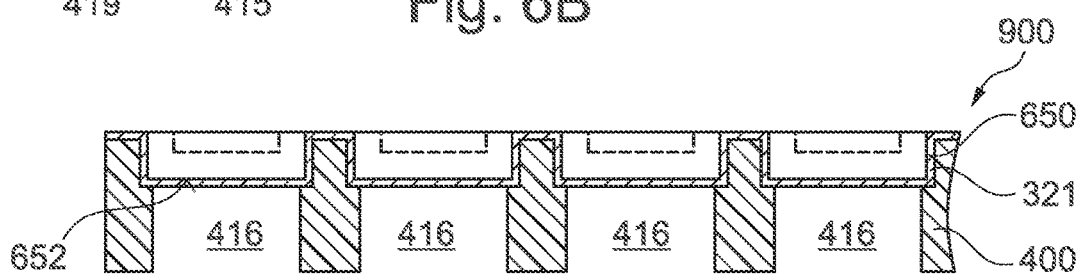

FIG. 6B shows a preform 410 applied on the backside surface 652 of the device regions 650 and FIG. 6C shows the grid-shaped mold structure 400 after removal of the preform 410 and after removal of the auxiliary carrier 680.

Figure 6D:
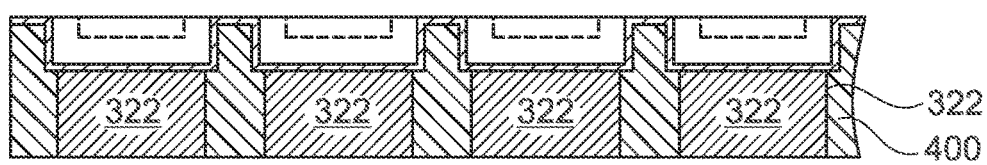

The grid-shaped mold structure 400 stabilizes the wafer assembly 900. Removal of the auxiliary carrier 680 makes the metal seed layer 321 accessible from the front side. An ECD (electrochemical deposition) process deposits a main metal portion 322 of the backside metal structure 320 in the spaces 416 left by the stencil portions 415 in the mold structure 400, as shown in FIG. 6D. The main metal portion 322 may include a copper layer with a thickness of at least 5 µm and at most 150 µm, typically in the range of 10 µm to 75 µm.

Figure 6E:
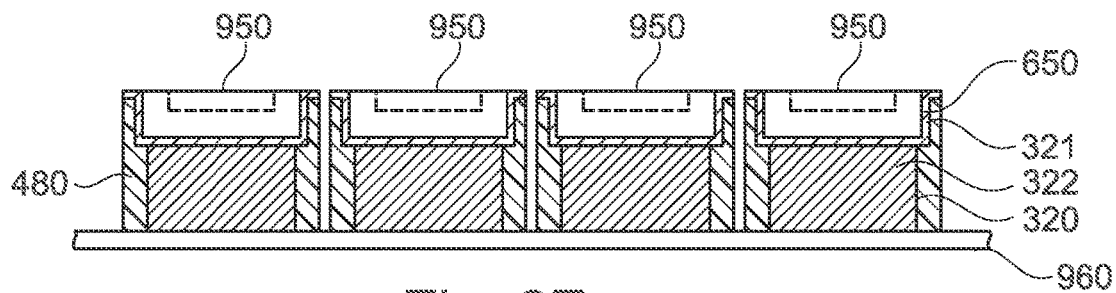

FIG. 6E shows the semiconductor dies 950 after separation of the device regions 650. Each frame structure 480 laterally completely embeds both the device region 650 and the backside metal structure 320 of a semiconductor die 950.

In FIGS. 7A-7D a preform 410 is formed such that the mold structure 400 leaves exposed an access portion 321a of the metal seed layer 321.

Figure 7A:
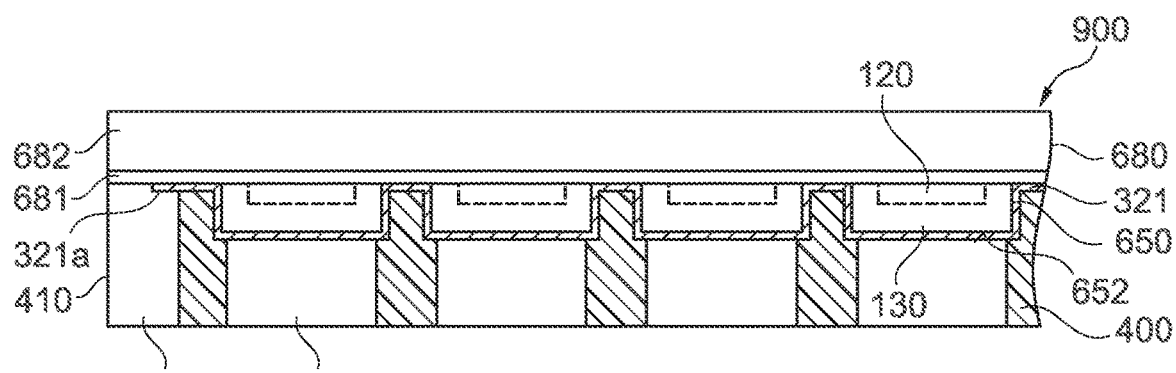
FIGS. 7A-7D show schematic cross-sectional views of a wafer assembly for illustrating a method of forming semiconductor devices according to another embodiment using a metal seed layer and a preform for molding.

In FIG. 7A the frame portion 419 of the mold structure 400 overlaps with an outermost portion of the metal seed layer 321.

Figure 7B:
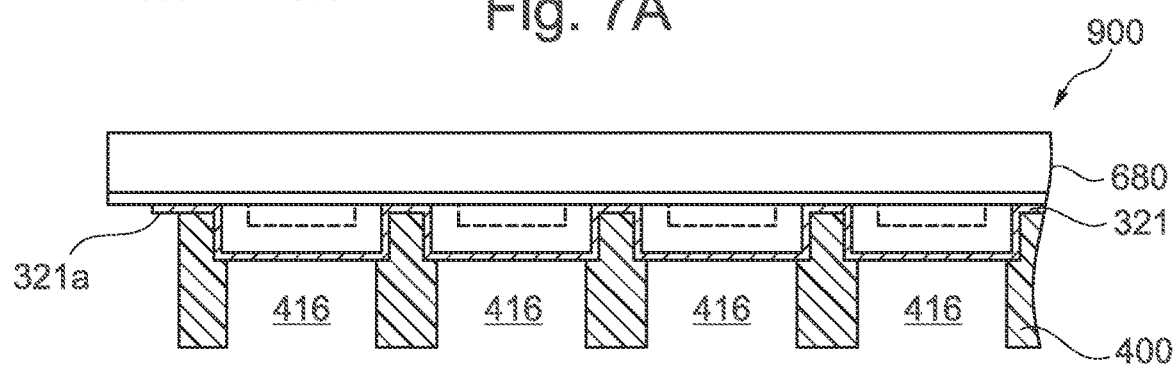

According to FIG. 7B the mold structure 400 does not completely cover the portion of the metal seed layer 321 formed on the auxiliary carrier 680 and exposes, in addition to portions of the backside surface 652 of the device regions 650, an access portion 321a of the metal seed layer 321 in a peripheral portion of the auxiliary carrier 680. An ECD process electrically contacts the access portion 321a of the metal seed layer 321 to control galvanic deposition of a metal in the spaces 416.

Figure 7C:
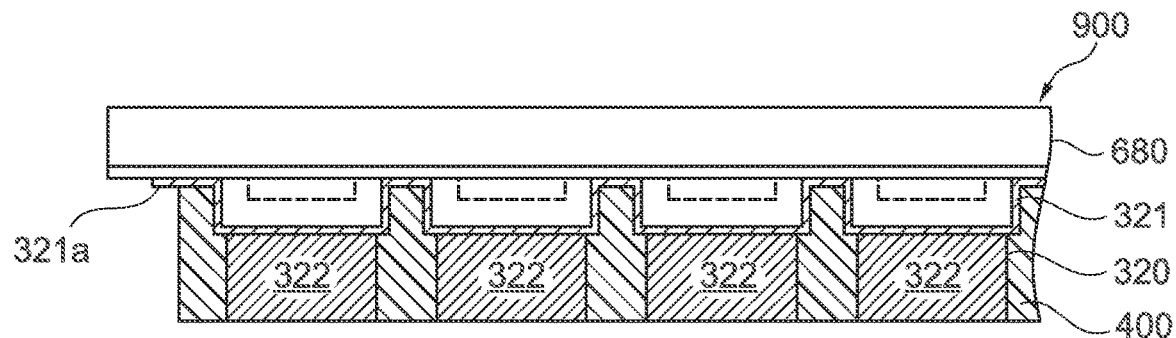

FIG. 7C shows the main metal portions 322 of the backside metal structures 320 formed by ECD, wherein during the ECD the auxiliary carrier 680 is connected to the device regions 650 and mechanically stabilizes the wafer assembly 900 during the electrochemical deposition process.

Figure 7D:
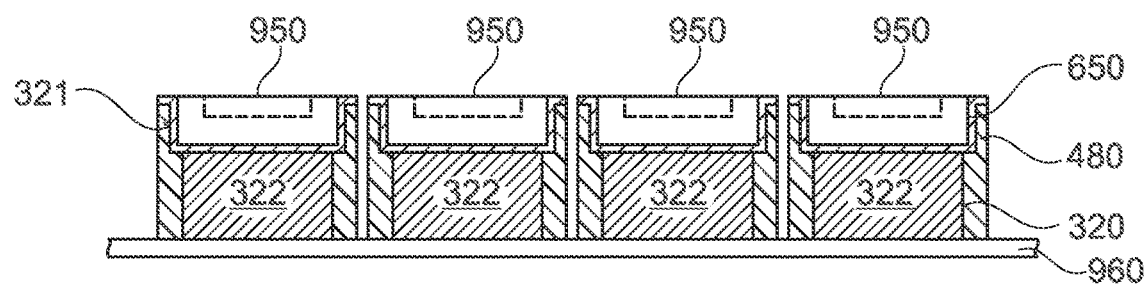

FIG. 7D corresponds to FIG. 6E, wherein horizontal portions of the metal seed layer 321 may be removed prior to the separation process, such that the separation process does not cut through portions of the metal seed layer 321.

FIGS. 8A-8D and 9A-9D refer to a molding structure 400 formed without preform. The mold material, e.g., a mold compound is applied directly in the groove 770 and on the backside surface 652 of the device region 650 of FIGS. 1B, 2B.

Figure 8A:
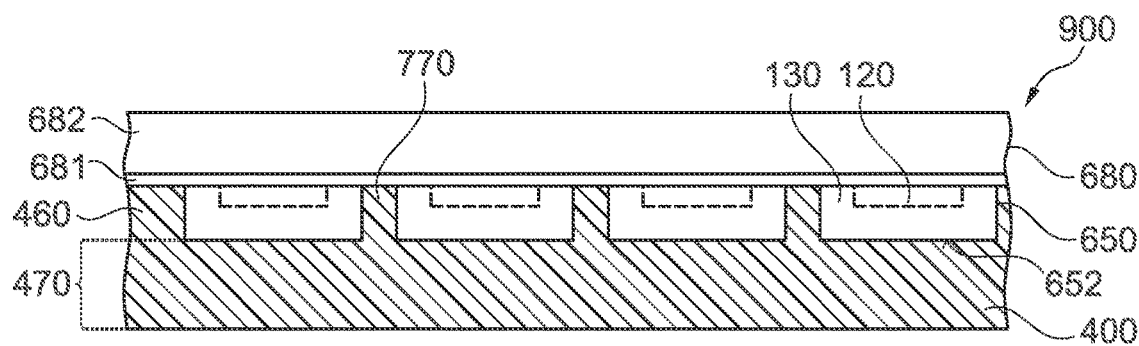
FIGS. 8A-8D show schematic cross-sectional views of a wafer assembly for illustrating a method of forming semiconductor devices with thin backside metallization according to another embodiment using a metal seed layer.

FIG. 8A shows that after solidification the mold structure 400 includes a groove portion 460 and a layer portion 470. The groove portion 460 fills the groove 770 of FIGS. 1B and 2B and the layer portion 470 is formed outside the groove 770 of FIGS. 1B and 2B on the backside surface 652 of the device regions 650. The layer portion 470 may be removed. For example a process including grinding and/or chemical-mechanical polishing may remove the layer portion 470.

Figure 8B:

As illustrated in FIG. 8B, after removal of the layer portion the groove portion 460 and the backside surface 652 of the device regions 650 form a flat plane. One or more metals may be deposited and patterned by a photolithography process FIG. 8C shows the resulting backside metal structures 320 formed by patterning the deposited metal(s) on the backside surface 652 of the device regions 650.

Figure 8C:
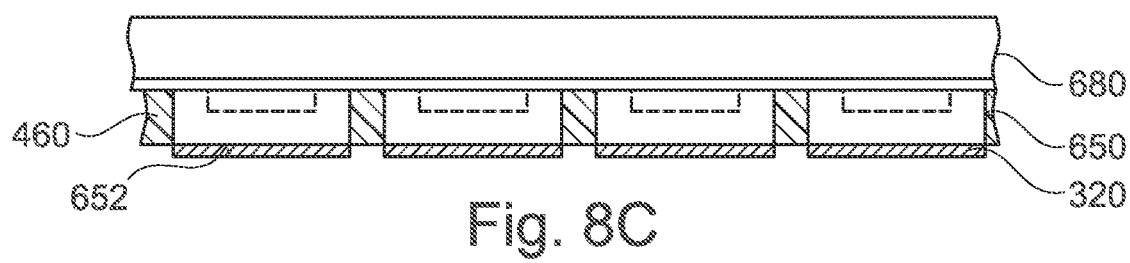
Figure 8D:
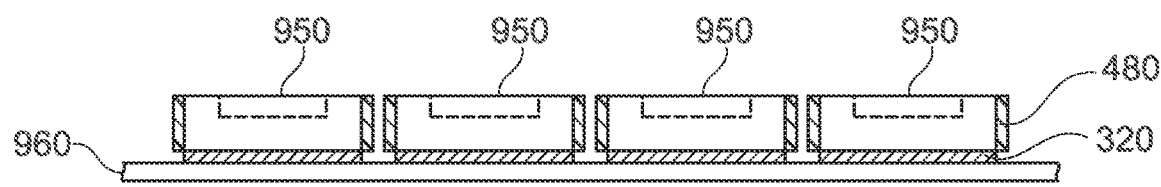

As illustrated in FIG. 8D, after separation the frame structures 480 laterally embed the semiconducting portions, i.e. the device regions 650 of FIG. 8C and leave exposed lateral sidewalls of the backside metal structures 320.

Figure 9A:
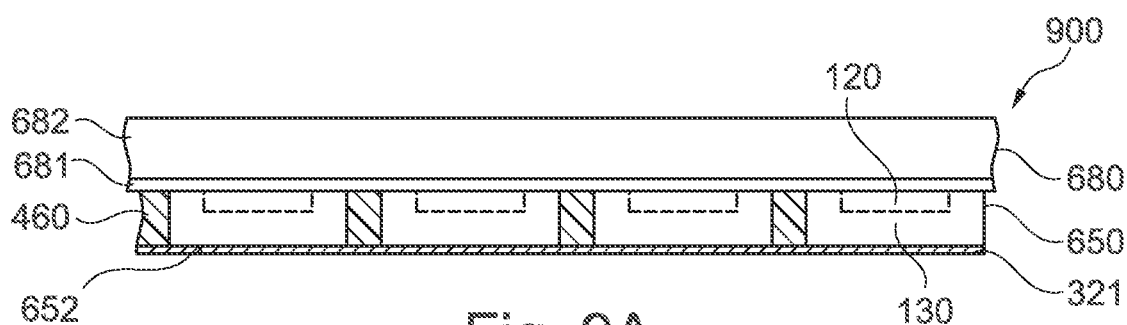
FIGS. 9A-9D show schematic cross-sectional views of a wafer assembly for illustrating a method of forming semiconductor devices according to an embodiment using pattern plating.

FIG. 9A shows a metal seed layer 321 deposited after removing the layer portion 470 of the mold structure 400 of FIG. 8A. Non-conductive material, for example, a resist may be deposited and patterned by a lithography process to form a plating mask 450.

Figure 9B:
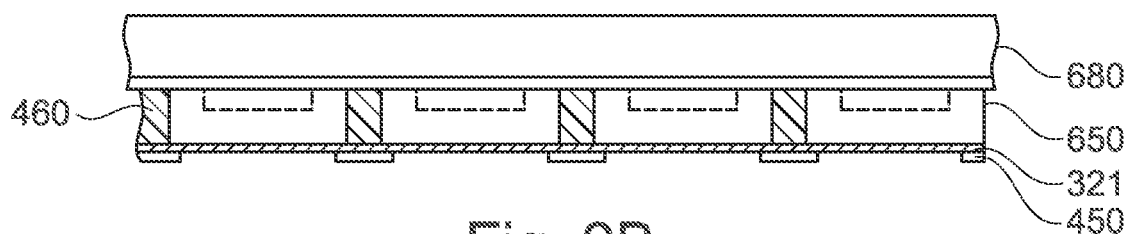

FIG. 9B shows the plating mask 450 formed from the patterned resist. The plating mask 450 covers a section of the metal seed layer 321 deposited directly on the mold structure 400 and exposes sections of the metal seed layer 321 deposited directly on the backside surface 652 of the device regions 650. A metal is deposited by electrochemical deposition selectively on the sections of the metal seed layer 321 on the backside surface 652 of the device regions 650.

Figure 9C:
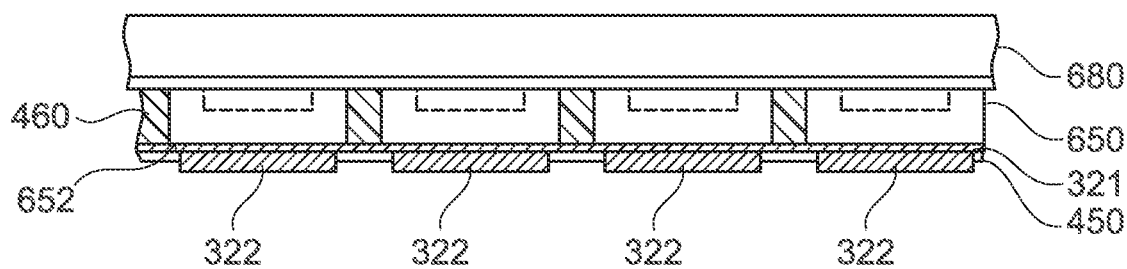

FIG. 9C shows main metal portions 322 formed by pattern plating of metal on the sections of the metal seed layer 321 deposited on the backside surface 652 of the device region 650.

Figure 9D:
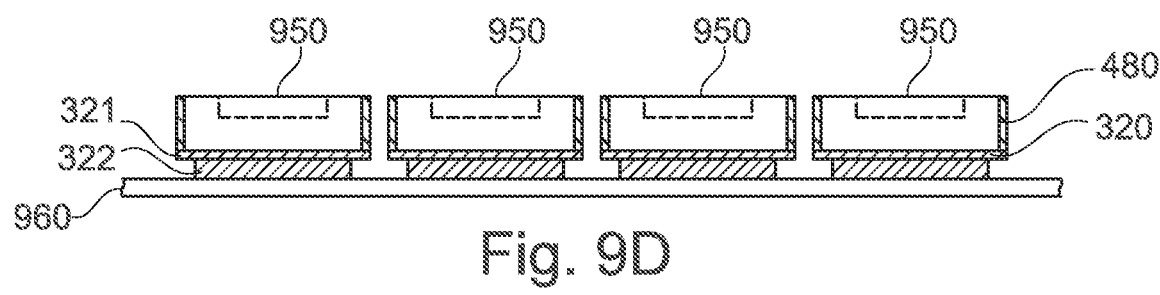

The semiconductor dies 950 of FIG. 9D may differ from the semiconductor dies 950 of FIG. 8D in a greater thickness of the backside metal structures 320, wherein a thicker backside metal structure 320 can temporarily store a greater amount of heat and may reduce thermal stress in the device regions 650.

FIGS. 10A-10G illustrate a method of applying a mold structure 400 selectively on the backside surface 662 of a kerf region 660 of a silicon carbide substrate 700.

Figure 10A:
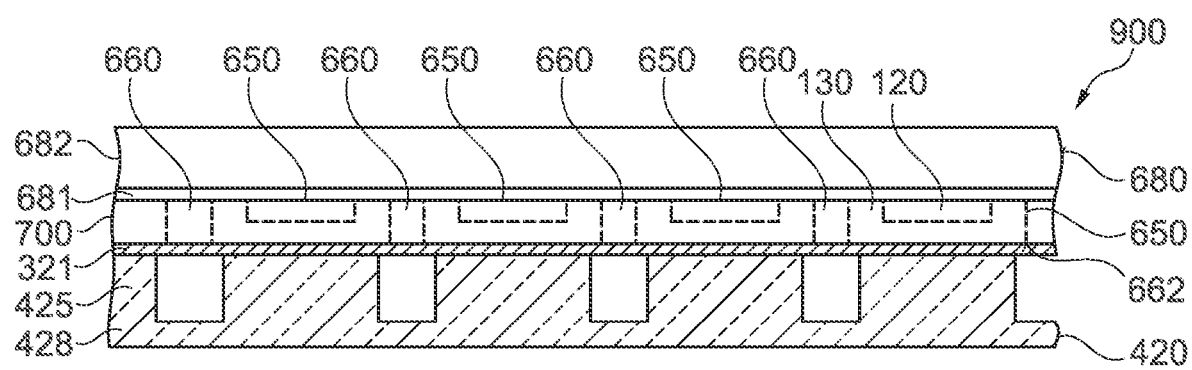
FIGS. 10A-10G show schematic cross-sectional views of a wafer assembly for illustrating a method of forming semiconductor devices according to an embodiment using a planar metal seed layer.

FIG. 10A shows a wafer assembly 900 with a silicon carbide substrate 700, an auxiliary carrier 680 provided at the front side of the silicon carbide substrate 700 and an auxiliary structure 420 provided at the backside of the silicon carbide substrate 700. A metal seed layer 321 may be formed between the silicon carbide substrate 700 and the auxiliary structure 420.

The silicon carbide substrate 700 includes a plurality of device regions 650 and a grid-shaped kerf region 660 laterally separating the device regions 650 from each other. As regards further details of the auxiliary carrier 680 and the silicon carbide substrate 700, reference is made to the former description.

The auxiliary structure 420 includes a plurality of laterally separated stencil sections 425 formed on the backside surface of the device region 650. Each stencil section 425 is assigned to one device region 650. A center-to-center distance between neighboring device regions 650 may be equal to a center-to-center distance between neighboring stencil sections 425. A layer section 428 of the auxiliary structure 420 may mechanically connect the stencil sections 425.

The auxiliary structure 420 of FIG. 10A may be pre-fabricated and then structurally connected with the silicon carbide substrate 700, e.g., by bonding, sintering and/or diffusion soldering. Alternatively, the auxiliary structure 420 may be formed stepwise directly on the metal seed layer 321. The stencil sections 425 are formed on sections of the metal seed layer 321 formed on the backside surface 652 of the device regions 650 and are absent on a section of the metal seed layer 321 formed on the backside surface 662 of the kerf region 660. The layer section 428 may be removed, for example, via grinding and/or wet etching.

Figure 10B:
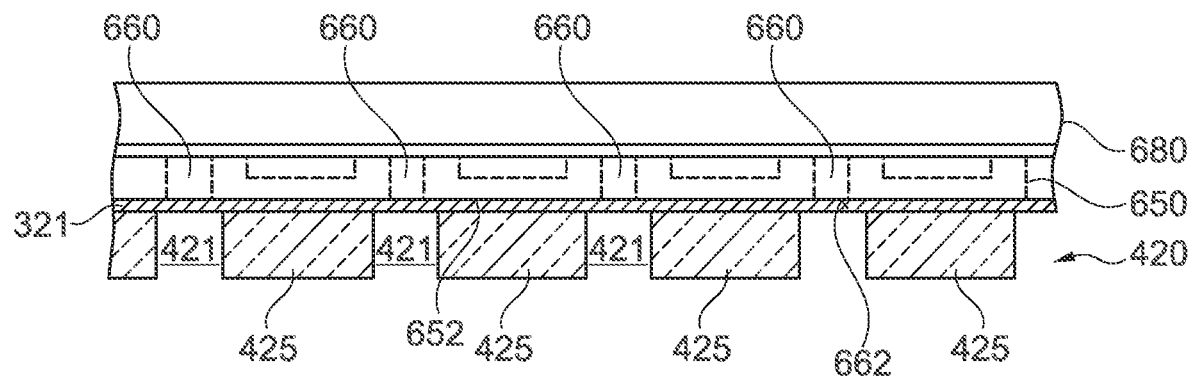

The auxiliary structure 420 of FIG. 10B includes laterally separated stencil sections 425 formed on sections of the metal seed layer 321 on the backside surface 652 of the device regions 650. A grid-shaped space 421 laterally separating the stencil sections 425 exposes a section of the metal seed layer 321 formed on the backside surface 662 of the kerf region 660.

Alternatively, the auxiliary structure 420 of FIG. 10B may be pre-fabricated by filling a plurality of laterally separated grooves in a top surface of an auxiliary base to form the stencil sections 425 in the grooves, mechanically connecting the stencil sections 425 with the silicon carbide substrate 700 and then removing the auxiliary base.

The auxiliary structure 420 may be pre-fabricated and perforated, i.e., the auxiliary structure 420 may include at least one hole and/or at least one recess. In this case, the stencil sections 425 may be interconnected (not shown in FIG. 10B). This may, for example, allow for mechanical support of the perforated carrier by the interconnections.

A mold process applies a mold material, e.g. a mold compound that fills at least the space 421.

Figure 10C:
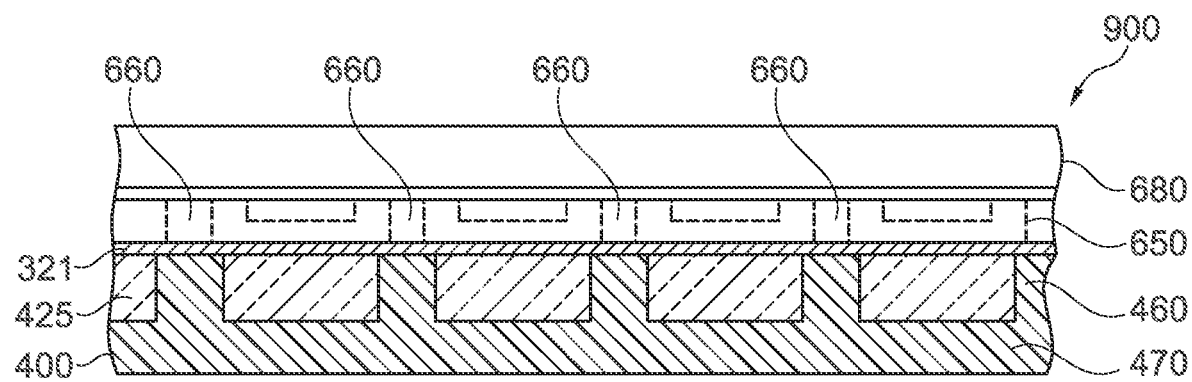

FIG. 10C shows a mold structure 400 formed from the mold material. The mold structure 400 includes a groove portion 460 filling the space 421 of FIG. 10B. The mold structure 400 may further include a layer portion 470 formed outside the space 421 of FIG. 10B. The layer portion 470 may be removed, for example by grinding.

Figure 10D:
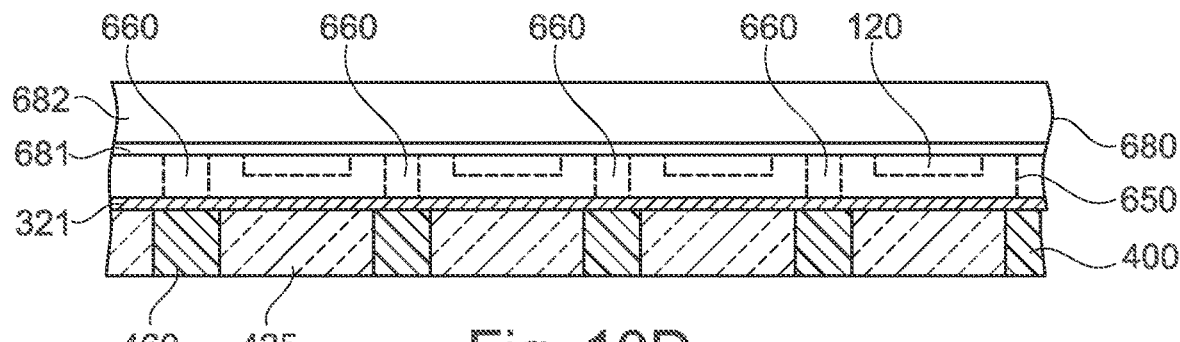

According to FIG. 10D, the grinding exposes and separates the stencil sections 425 of the auxiliary structure 420. The stencil sections 425 may be removed selectively with regard to the mold structure 400.

Figure 10E:
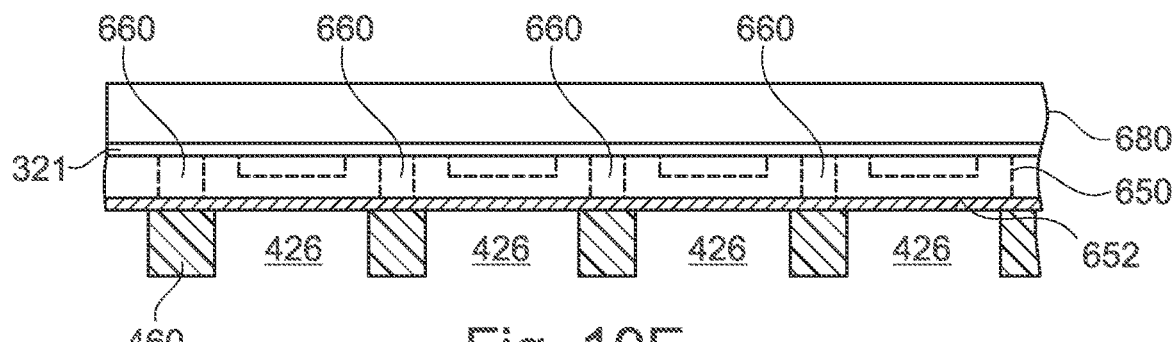

FIG. 10E shows the spaces 426 left by removal of the stencil portions 425 of the auxiliary structure 420. Main metal portions 322 of a backside metal structure 320 may be formed in the spaces 426, for example, by using a metal paste or by electrochemical deposition of a metal.

Alternatively to the process described with reference to FIGS. 10A-10E, the mold structure 400 of FIG. 10E may be formed by using a preform 410 as described with reference to FIGS. 5A-7D.

Figure 10F:
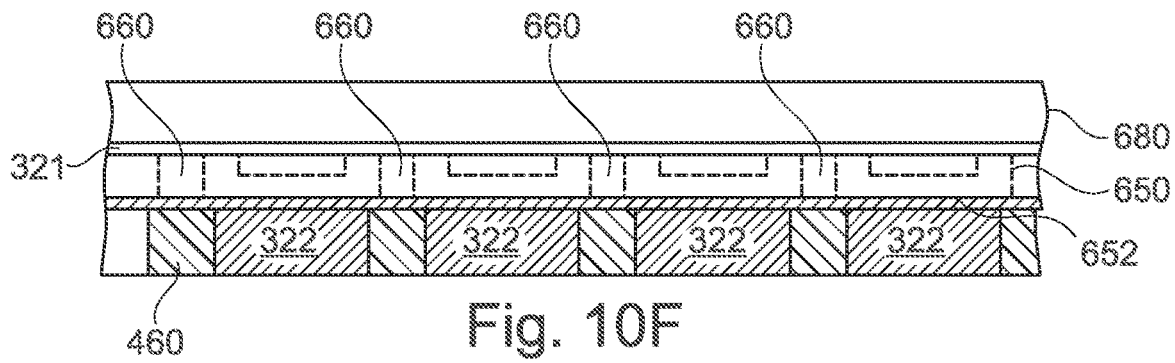

FIG. 10F shows the main metal portions 322 formed in the spaces 426 of FIG. 10E.

Figure 10G:
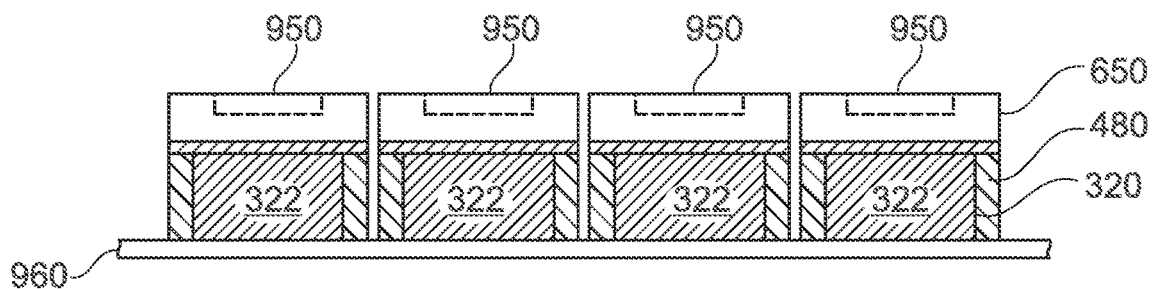

A separation process results in semiconductor dies 950 with frame structures 480 formed from parts (e.g., remaining parts or residuals) of the mold structure 400 of FIG. 10F. Each frame structure 480 laterally embeds the main metal portion 322 of the backside metal structures 320, as shown in FIG. 10G.

According to another embodiment (not illustrated) formation of the seed metal layer 321 may be omitted such that the auxiliary structure 420 is formed directly on the backside surface 652 of the device regions 650. The backside metal structures 320 may be formed, for example, from a metal paste and/or stencil printing. In addition or as an alternative, the backside metal structures 320 and/or at least a layer of the backside metal structures 320 may be formed by means of sputter deposition and/or vapor deposition.

FIGS. 11A-11C and 12 show exemplary embodiments of a semiconductor die 950 and a semiconductor device 970 that may be manufactured with a method as described in connection with the embodiments of FIGS. 1A-1D, 2A-2D, 3A-3D, 4A-4D, 5A-5D, 6A-6E, 7A-7D, 8A-8CD, and 9A-9D. Vice versa, FIGS. 1A-1D, 2A-2D, 3A-3D, 4A-4D, 5A-5D, 6A-6E, 7A-7D, 8A-8CD, and 9A-9D show exemplary embodiments of a method of manufacturing a semiconductor device 970, wherein the semiconductor device 970 may be a semiconductor device as described herein, in particular in connection with the embodiments of FIGS. 11A-11C and 12. FIG. 11D shows an exemplary embodiment of a semiconductor die 950 that may be manufactured with a method as described in connection with the embodiment of FIGS. 10A-10G. Vice versa, FIGS. 10A-10G show an exemplary embodiment of a method of manufacturing a semiconductor device with a semiconductor die 950 as described herein in connection with the embodiment of FIG. 11D.

Figure 11A:
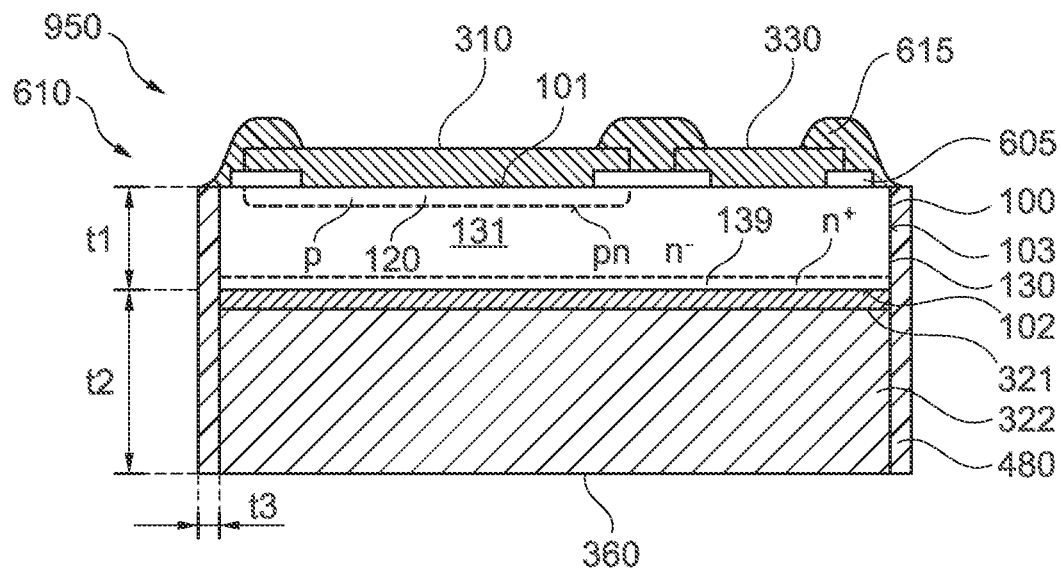
FIGS. 11A-11D illustrate schematic cross-sectional views of semiconductor dies including frame structures according to other embodiments.
Figure 11B:
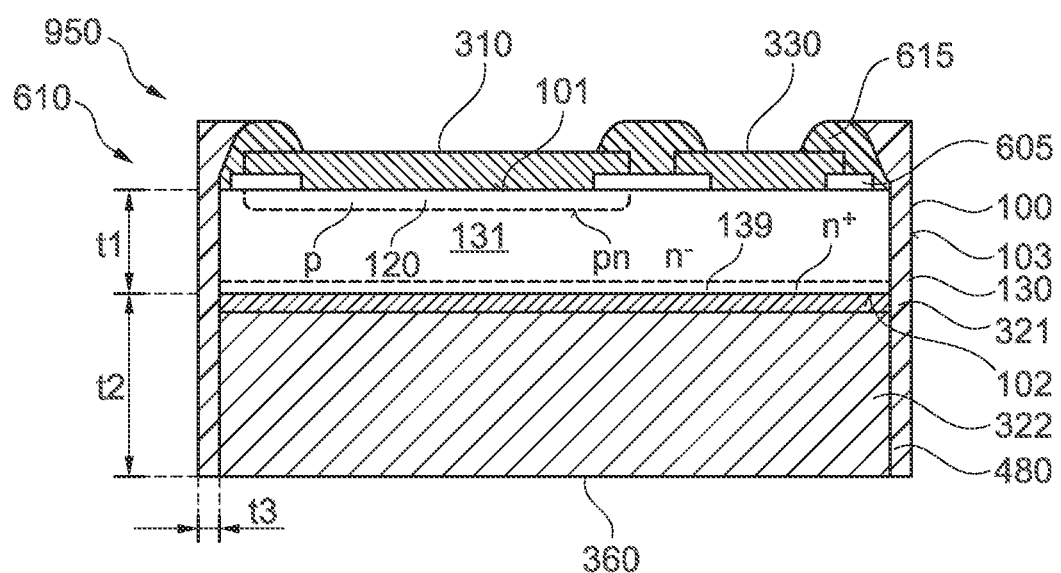

Each of the semiconductor dies 950 of FIG. 11A-11B may be the semiconductor die of a power semiconductor device that may be used as switch or rectifier in power electronics. For example, the power semiconductor device may be a semiconductor diode. According to an embodiment the semiconductor die 950 may include a plurality of substantially identical transistor cells electrically arranged in parallel. For example, the semiconductor die 950 may be that of a HEMT (high electron mobility transistor), an IGFET (insulated gate field effect transistor), for example, a MOSFET, a JFET, a merged-pin Schottky diode (MPS diode), an IGBT, or an MCD or combinations of them.

The semiconductor die 950 may include a silicon carbide body 100 based on 4H—SiC (silicon carbide of the 4H polytype) with a first surface 101 at a front side and a second surface 102 at a backside. A plurality of doped regions may be formed in the silicon carbide body 100. For example, the silicon carbide body 100 may include a first doped region 120 and a second doped region 130. The first doped region 120 may include an emitter region, wherein the emitter region may include the anode region of a power semiconductor diode or may include the body region(s) of transistor cells, e.g., field effect transistor cells. The first doped region 120 and the second doped region 130 may form a pn junction pn. The second doped region 130 may include a heavily doped contact portion 139 formed along the second surface 102 and a lightly doped drift zone 131 between the first doped region 120 and the contact portion 139. A first thickness t1 of the silicon carbide body 100 may be smaller than 200 μm, for example, at most 130 μm or at most 120 μm.

On the first surface 101 at the front side of the silicon carbide body 100 an interlayer dielectric 605 may separate portions of a front side metallization 610 from the silicon carbide body 100. At least a portion of the front side metallization 610 may be in contact with the first doped region 120, e.g., an emitter region. The front side metallization 610 may include a gate pad 330 and a first load electrode 310 that may include a source pad. A passivation structure 615 may include a layer that covers vertical edges of the front side metallization 610. The passivation structure 615 may include an organic material (e.g., polyimide, BCB, polysilazane, SiCOH) and/or an inorganic material (e.g., silicon nitride, glass, SOS, SOG, diamond-like carbon, sapphire, aluminum oxide).

At the backside, a second load electrode 360 and the contact portion 139 may form an ohmic contact. The second load electrode 360 may include a metal seed layer 321 and a main metal portion 322. A second thickness t2 of the second load electrode 360 may be in a range from 30 μm to 300 μm, for example from 80 μm to 120 μm.

In FIG. 11A a one-piece frame structure 480 laterally surrounds the silicon carbide body 100 and the second load electrode 360, wherein the frame structure 480 is in direct contact with a sidewall surface 103 of the silicon carbide body 100. The vertical extension of the frame structure 480 along the sidewall surface 103 may be at least equal to the first thickness t1 or at least equal to the sum of the first thickness t1 and the second thickness t2. A third thickness t3 of the frame structure 480 may be in a range from 5 μm to 150 μm, for example from 10 μm to 75 μm.

Along each of the sidewall surfaces 103, the frame structure 480 may have a uniform third thickness t3 along the complete vertical extension. The third thickness t3 for four sidewalls of a semiconductor die 950 with rectangular horizontal cross-section may differ from each other.

In FIG. 11B the frame structure 480 extends beyond the first surface 101 and covers the outward slope of the outermost portion of the passivation structure 615 and/or the outermost edges of the front side metallization 610.

Figure 11C:
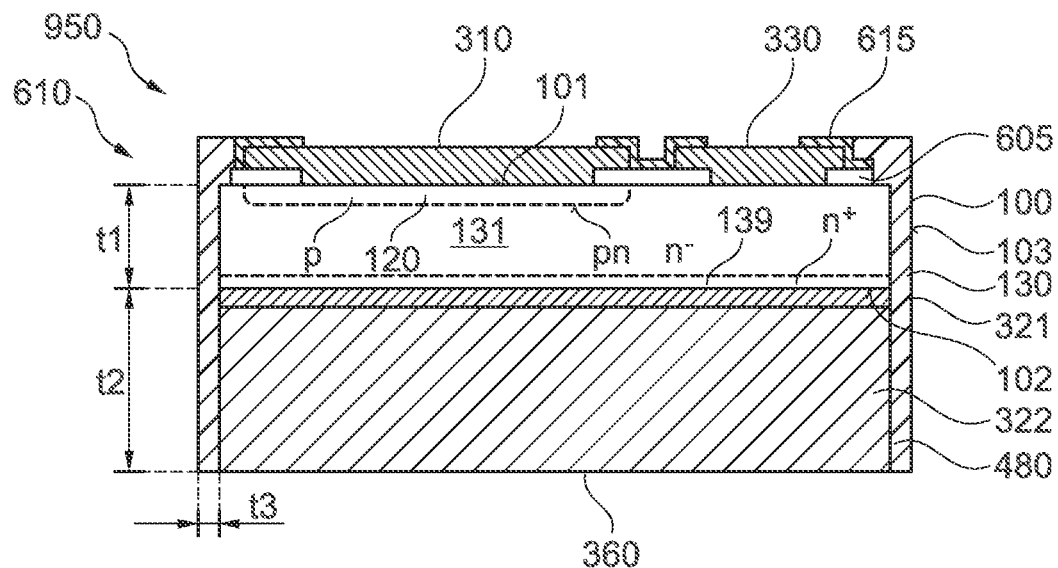
Figure 11D:
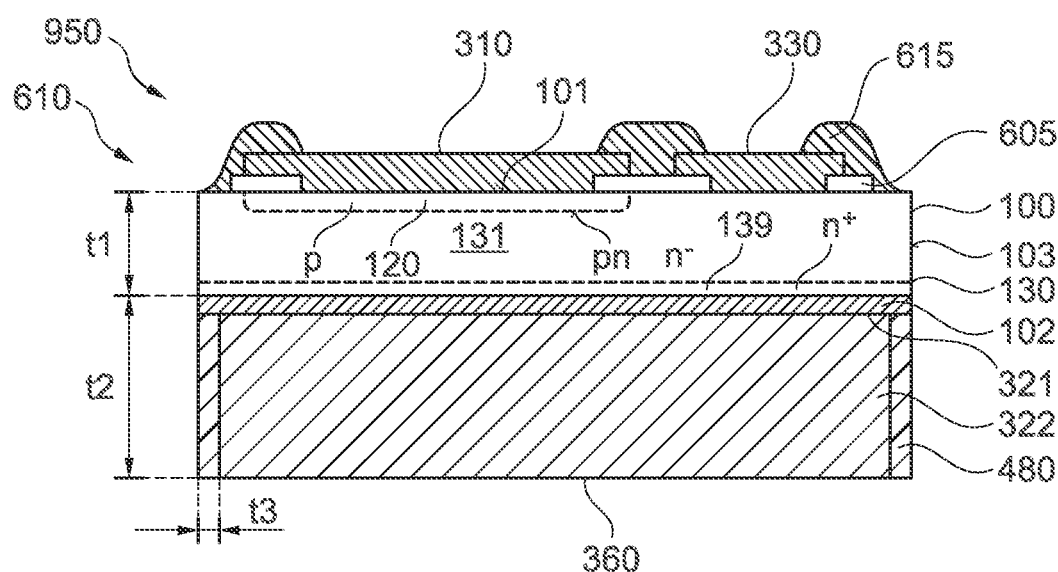

FIG. 11C shows a frame structure 480 covering outward slopes of a highly conformal passivation structure 615, wherein the passivation structure 615 may include an inorganic dielectric material such as silicon nitride, or a copper oxide. Alternatively, the passivation structure 615 may be completely absent or may be absent at least along the outer edges of the front side metallization 610, such that the frame structure 480 may be in direct contact with the outer edges of the front side metallization 610.

In FIG. 11D a one-piece frame structure 480 laterally surrounds the second load electrode 360 and is absent along the silicon carbide body 100. The vertical extension of the frame structure 480 may be equal to the second thickness t2.

The frame structures 480 of FIGS. 11A and 11B include or consist of a mold compound as used for wafer level packaging technologies such as eWLB. For example, the mold compound may include or consist of an epoxy resin.

Figure 12:
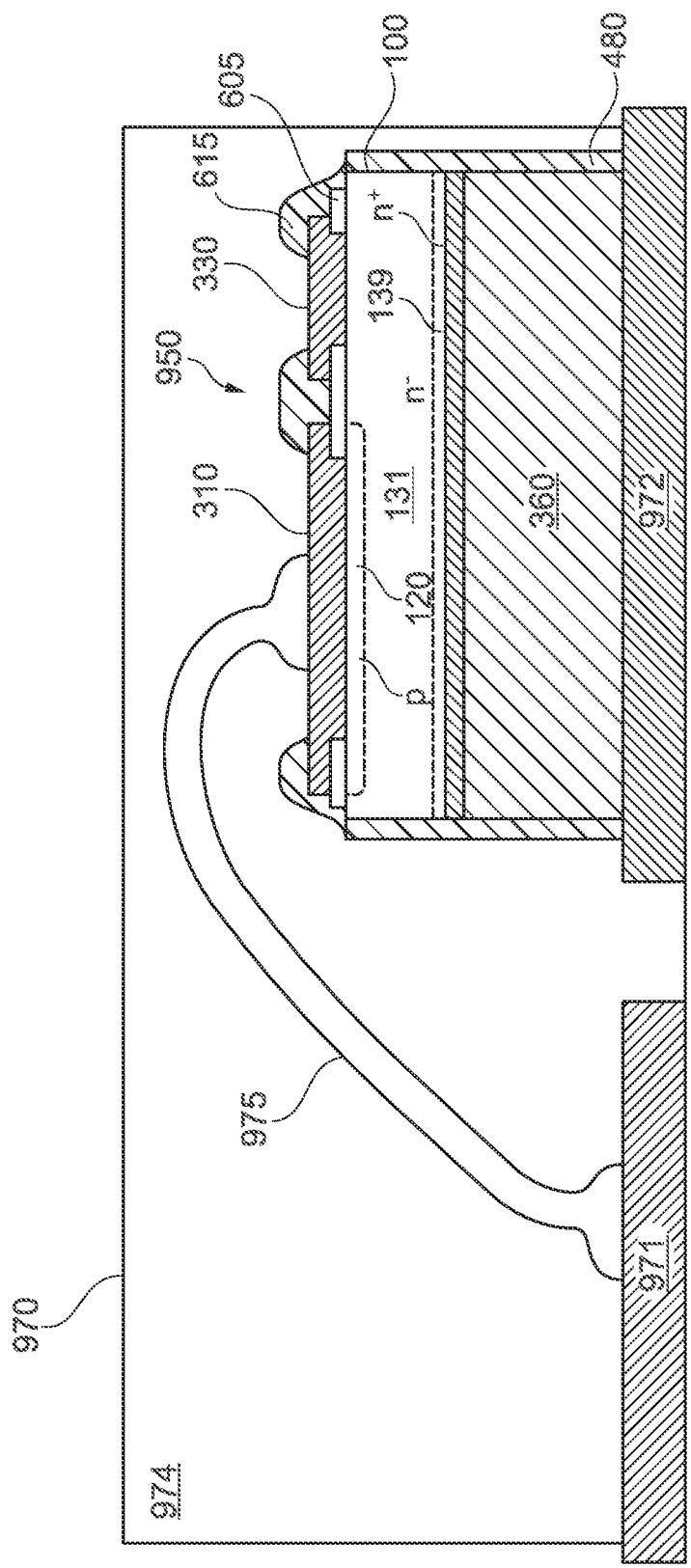
FIG. 12 illustrates a schematic cross-sectional view of a semiconductor device with a semiconductor die including a frame structure according to a further embodiment.

FIG. 12 shows a semiconductor device 500 that may include one of the semiconductor dies 950 as illustrated in FIGS. 11A and 11B. A second load electrode 360 of the semiconductor die 950 may be structurally and electrically connected with a load terminal, e.g., with a drain terminal 972. For example, the second load electrode 360 may be soldered or sintered onto the drain terminal 972. A lateral horizontal area of the drain terminal 972 may be significantly greater than a horizontal cross-sectional area of the semiconductor die 950. A thickness of the drain terminal 972 may be in a range from 200 μm to 2000 μm.

The first load electrode 310 may be electrically connected with another load terminal, e.g., a source terminal 971, e.g., through a bond wire/metal clip 975. Another bond wire may electrically connect the gate pad 330 with a gate terminal (not shown in FIG. 12). The drain terminal 972, the source terminal 971 and the gate terminal may be arranged coplanar and may be separated sections of a lead frame. A mold body 974 may encapsulate the bond wire/metal clip 975, the semiconductor die 950 and parts of the gate terminal, the drain terminal 972 and the source terminal 971.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
providing a silicon carbide substrate that comprises a plurality of device regions and a grid-shaped kerf region laterally separating the device regions;
forming a mold structure from a mold material that includes glass, ceramic or a polymer-based material, on a backside surface of the grid-shaped kerf region which faces an opposite direction as a front side surface of the silicon carbide substrate and in which the device regions are formed;
forming backside metal structures on a backside surface of the device regions which faces the same direction as the backside surface of the grid-shaped kerf region and the opposite direction as the front side surface in which the device regions are formed;
separating the device regions; and
prior to forming the mold structure, providing an auxiliary structure that comprises stencil sections,
wherein the stencil sections are provided on the backside surface of the device regions and each stencil section is assigned to one device region,
wherein the mold structure fills a space between the stencil sections,
wherein parts of the mold structure form frame structures laterally surrounding the backside metal structures.

2. The method of claim 1, further comprising:
after forming the mold structure, removing the auxiliary structure.

3. The method of claim 2, further comprising:
after removing the auxiliary structure, forming at least a portion of the backside metal structures in spaces left by removing the stencil sections.

4. The method of claim 3, further comprising:
prior to providing the auxiliary structure, forming a metal seed layer on the backside surface of the device regions,
wherein forming the backside metal structures comprises electrochemical deposition of a main metal portion on exposed sections of the metal seed layer in the spaces.

5. The method of claim 1, wherein a center-to-center distance between neighboring ones of the device regions is equal to a center-to-center distance between neighboring ones of the stencil sections.

6. The method of claim 1, wherein a layer section of the auxiliary structure mechanically connects the stencil sections.

7. The method of claim 1, wherein providing the auxiliary structure comprises:
pre-fabricating the auxiliary structure; and
structurally connecting the pre-fabricated auxiliary structure with the silicon carbide substrate.

8. The method of claim 7, wherein structurally connecting the pre-fabricated auxiliary structure with the silicon carbide substrate comprises bonding, sintering and/or diffusion soldering.

9. The method of claim 7, wherein pre-fabricating the auxiliary structure comprises:
filling a plurality of laterally separated grooves in a top surface of an auxiliary base to form the stencil sections in the grooves;
mechanically connecting the stencil sections with the silicon carbide substrate; and
after mechanically connecting the stencil sections with the silicon carbide substrate, removing the auxiliary base.

10. The method of claim 7, wherein the pre-fabricated auxiliary structure is perforated and includes at least one hole and/or at least one recess.

11. The method of claim 10, wherein the stencil sections are interconnected.

12. The method of claim 1, wherein providing the auxiliary structure comprises:
forming stepwise the auxiliary structure directly on a metal seed layer formed on the device regions.

13. The method of claim 12, wherein the stencil sections are formed on sections of the metal seed layer formed on the backside surface of the device regions and are absent on a section of the metal seed layer formed on the backside surface of the grid-shaped kerf region.

14. The method of claim 12, wherein a grid-shaped space laterally separating the stencil sections exposes a section of the metal seed layer formed on the backside surface of the grid-shaped kerf region.

15. The method of claim 1, wherein the mold structure includes a layer portion formed outside the space between the stencil sections.

16. The method of claim 15, further comprising:
removing the layer portion of the mold structure to expose the stencil sections of the auxiliary structure.

17. The method of claim 1, wherein the auxiliary structure is formed directly on the backside surface of the device regions.

18. The method of claim 1, wherein the mold structure is formed by using a preform.

19. The method of claim 1, wherein the backside metal structures are formed from a metal paste and/or stencil printing, and/or wherein the backside metal structures and/or at least a layer of the backside metal structures are formed by sputter deposition and/or vapor deposition.

20. A method of manufacturing a semiconductor device, the method comprising:

providing a silicon carbide substrate that comprises a plurality of device regions and a grid-shaped kerf region laterally separating the device regions;

forming a mold compound on a backside surface of the grid-shaped kerf region which faces an opposite direction as a front side surface of the silicon carbide substrate and in which the device regions are formed;

forming backside metal structures on a backside surface of the device regions which faces the same direction as the backside surface of the grid-shaped kerf region and the opposite direction as the front side surface in which the device regions are formed; and separating the device regions, wherein parts of the mold compound form frame structures laterally surrounding the backside metal structures.

21. The method of claim 20, wherein the mold compound comprises an epoxy resin.

* * * * *